United States Patent
Lee et al.

(10) Patent No.: US 11,569,563 B2
(45) Date of Patent: Jan. 31, 2023

(54) SEMICONDUCTOR PACKAGES AND METHOD OF MANUFACTURING SEMICONDUCTOR PACKAGES

(71) Applicant: SAMSUNG ELECTRONICS CO., LTD., Suwon-si (KR)

(72) Inventors: Yongkoon Lee, Suwon-si (KR); Jingu Kim, Suwon-si (KR); Sangkyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 139 days.

(21) Appl. No.: 17/205,055

(22) Filed: Mar. 18, 2021

(65) Prior Publication Data
US 2022/0006173 A1 Jan. 6, 2022

(30) Foreign Application Priority Data
Jul. 3, 2020 (KR) .................. 10-2020-0082296

(51) Int. Cl.
*H01Q 1/22* (2006.01)
*H01L 23/66* (2006.01)
*H01L 23/00* (2006.01)

(52) U.S. Cl.
CPC ........... *H01Q 1/2283* (2013.01); *H01L 23/66* (2013.01); *H01L 24/20* (2013.01); *H01L 2223/6616* (2013.01); *H01L 2223/6677* (2013.01); *H01L 2224/211* (2013.01); *H01L 2224/2101* (2013.01); *H01L 2224/214* (2013.01); *H01L 2924/1421* (2013.01); *H01L 2924/172* (2013.01); *H01L 2924/173* (2013.01)

(58) Field of Classification Search
CPC ... H01Q 1/2283; H01L 23/66; H01L 23/5389; H01L 2223/6677; H01L 2224/214; H01L 24/20
USPC .......................................... 257/728
See application file for complete search history.

(56) References Cited

U.S. PATENT DOCUMENTS

| | | | |
|---|---|---|---|
| 9,153,863 B2 | 10/2015 | Nair et al. | |
| 10,354,964 B2 | 7/2019 | Yu et al. | |
| 10,468,355 B2 | 11/2019 | Wu et al. | |
| 10,483,617 B2 | 11/2019 | Chuang et al. | |
| 10,490,880 B2 | 11/2019 | Lasiter et al. | |
| 10,511,080 B2 | 12/2019 | So et al. | |
| 11,004,796 B2 * | 5/2021 | Tu | H01L 24/19 |
| 11,289,433 B2 * | 3/2022 | Tseng | H01L 23/055 |
| 2018/0012852 A1 | 1/2018 | Kamgaing et al. | |
| 2019/0122978 A1 * | 4/2019 | Tang | H01L 23/485 |
| 2019/0139912 A1 * | 5/2019 | Kim | H01L 21/4853 |
| 2019/0378801 A1 | 12/2019 | Leitgeb et al. | |
| 2020/0013735 A1 * | 1/2020 | Liu | H01L 23/481 |
| 2020/0020653 A1 * | 1/2020 | Lim | H01Q 1/243 |

(Continued)

*Primary Examiner* — Dao H Nguyen
(74) *Attorney, Agent, or Firm* — Lee IP Law, P.C.

(57) ABSTRACT

A semiconductor package includes a redistribution wiring layer having redistribution wirings, a semiconductor chip on the redistribution wiring layer, a frame on the redistribution wiring layer, the frame surrounding the semiconductor chip, and the frame having core connection wirings electrically connected to the redistribution wirings, and an antenna structure on the frame, the antenna structure including a ground pattern layer, a first antenna insulation layer, a radiator pattern layer, a second antenna insulation layer, and a director pattern layer sequentially stacked on one another.

20 Claims, 30 Drawing Sheets

(56) References Cited

U.S. PATENT DOCUMENTS

| | | | |
|---|---|---|---|
| 2020/0135671 A1* | 4/2020 | Chen | ................ H01L 21/568 |
| 2020/0303335 A1* | 9/2020 | Chu | ............ H01L 23/49838 |

\* cited by examiner

SEMICONDUCTOR PACKAGES AND METHOD OF MANUFACTURING SEMICONDUCTOR PACKAGES

CROSS-REFERENCE TO RELATED APPLICATION

Korean Patent Application No. 10-2020-0082296, filed on Jul. 3, 2020, in the Korean Intellectual Property Office, and entitled: "Semiconductor Packages and Method of Manufacturing the Semiconductor Packages," is incorporated by reference herein in its entirety.

BACKGROUND

1. Field

Example embodiments relate to a semiconductor package and a method of manufacturing the semiconductor package. More particularly, example embodiments relate to a semiconductor package including a semiconductor chip mounted therein and a method of manufacturing the same.

2. Description of the Related Art

In mobile communication, as a service frequency increases to expand a bandwidth, an antenna in package (AiP) has been developed. The AiP may include an antenna and a radio frequency integrated circuit (RFIC) that are integrated together.

SUMMARY

According to example embodiments, a semiconductor package includes a redistribution wiring layer having redistribution wirings, a semiconductor chip arranged on the redistribution wiring layer, a frame on the redistribution wiring layer to surround the semiconductor chip and having core connection wirings electrically connected to the redistribution wirings, and an antenna structure provided on the frame and including a ground pattern layer, a first antenna insulation layer, a radiator pattern layer, a second antenna insulation layer and a director pattern layer sequentially stacked on one another.

According to example embodiments, a semiconductor package includes a frame having a cavity, a semiconductor chip arranged within the cavity, a redistribution wiring layer arranged on a lower surface of the frame and having redistribution wirings electrically connected to chip pads of the semiconductor chip, and an antenna structure provided on an upper surface of the frame and including a ground pattern layer, a first antenna insulation layer, a radiator pattern layer, a second antenna insulation layer and a director pattern layer sequentially stacked on one another. The first antenna insulation layer has a first thermal expansion coefficient, and the second antenna insulation layer has a second thermal expansion coefficient smaller than the first thermal expansion coefficient.

According to example embodiments, a semiconductor package includes a semiconductor chip, a frame surrounding the semiconductor chip and having core connection wirings, a redistribution wiring layer arranged on a lower surface of the frame and having redistribution wirings electrically connected to chip pads of the semiconductor chip, and an antenna structure provided on an upper surface of the frame and including a ground pattern layer, a first antenna insulation layer, a radiator pattern layer, a second antenna insulation layer and a director pattern layer sequentially stacked on one another. The radiator pattern layer is electrically connected to the redistribution wiring through the core connection wiring.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, example embodiments will be explained in detail with reference to the accompanying drawings.

Figure 1:
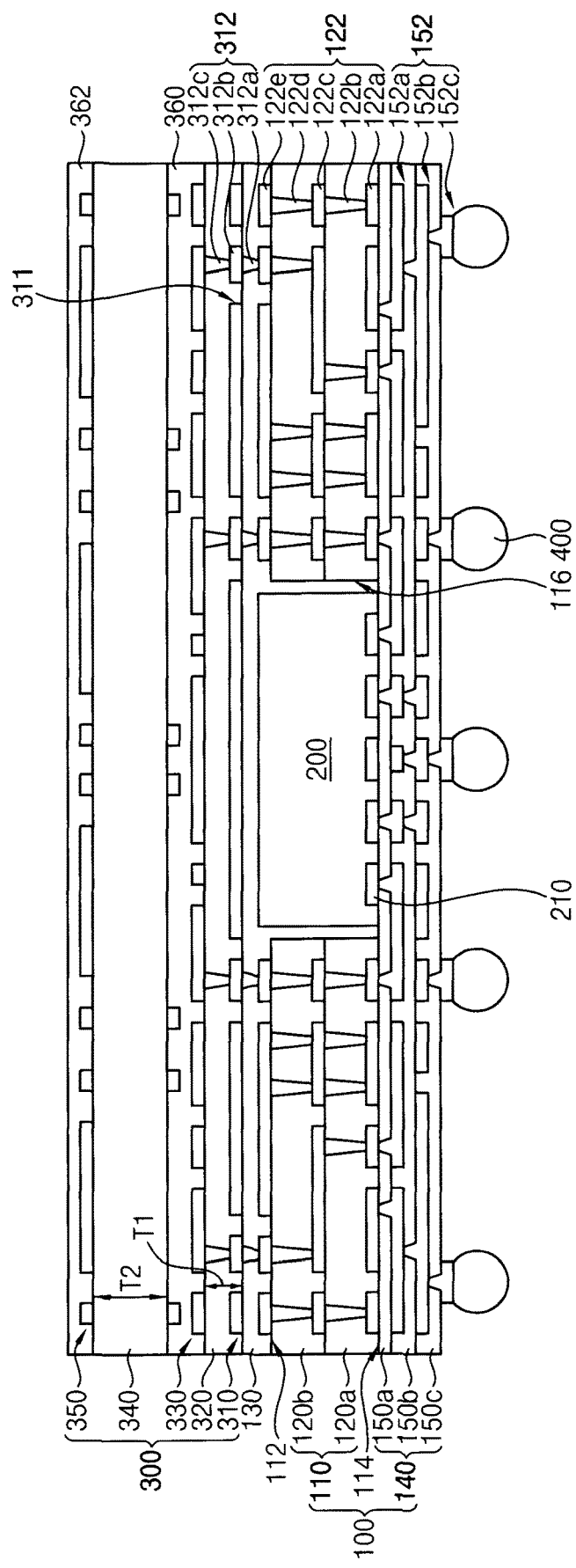
FIG. 1 is a cross-sectional view illustrating a semiconductor package in accordance with example embodiments.
Figure 2A:
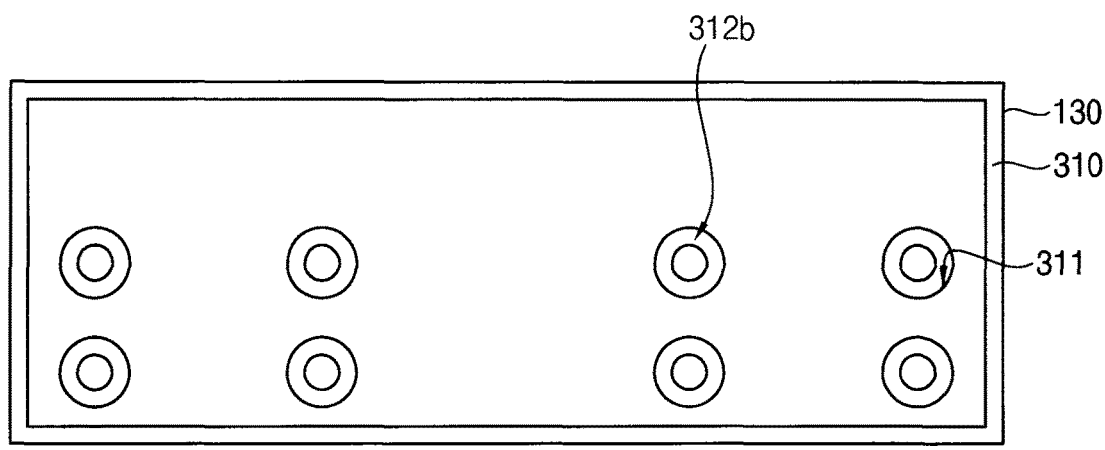
FIG. 2A is a plan view illustrating a ground pattern layer of an antenna structure in FIG. 1.
Figure 2B:
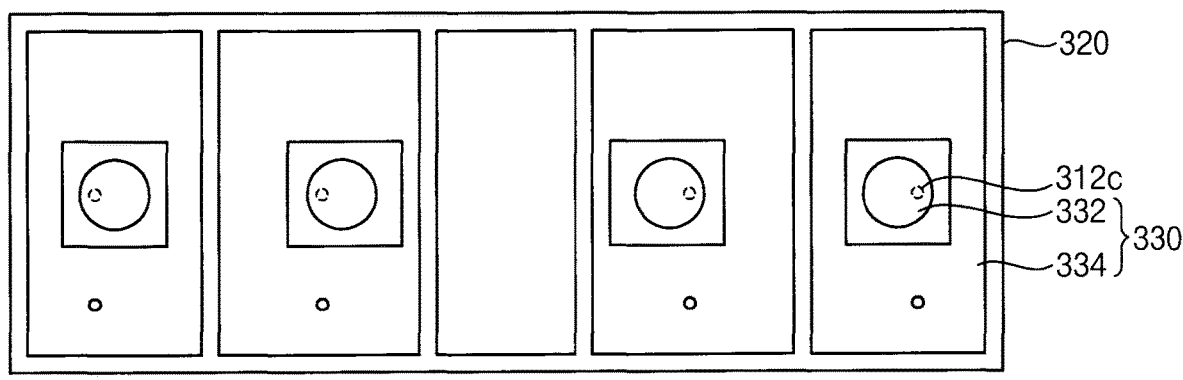
FIG. 2B is a plan view illustrating a radiator pattern layer of the antenna structure in FIG. 1.

FIG. 1 is a cross-sectional view illustrating a semiconductor package in accordance with example embodiments. FIG. 2A is a plan view illustrating a ground pattern layer of an antenna structure in FIG. 1, FIG. 2B is a plan view illustrating a radiator pattern layer of the antenna structure in FIG. 1, and FIG. 2C is a plan view illustrating a director pattern layer of the antenna structure in FIG. 1.

Figure 2C:
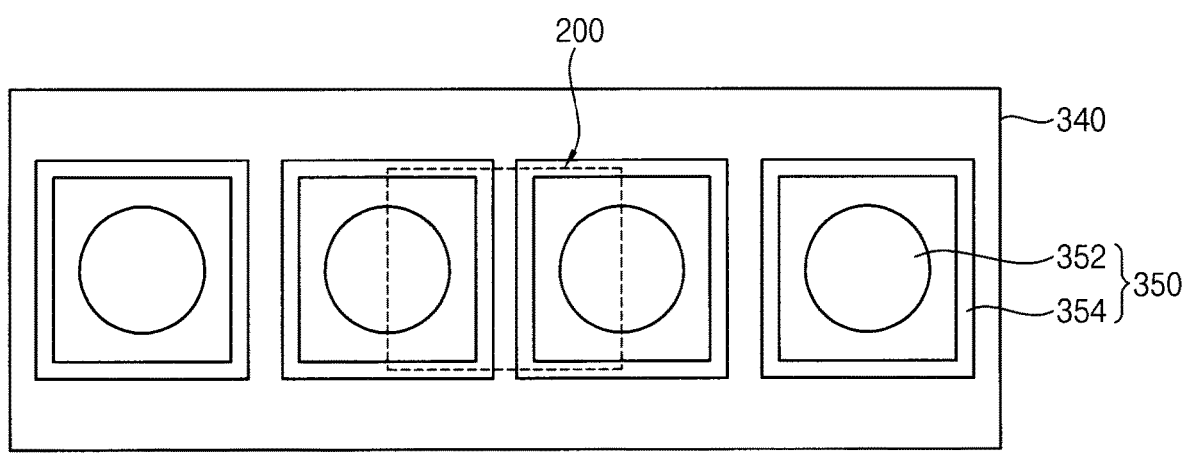
FIG. 2C is a plan view illustrating a director pattern layer of the antenna structure in FIG. 1.

Referring to FIGS. 1 to 2C, a semiconductor package 10 may include a fan-out package 100 and an antenna structure 300 adhered on the fan-out package 100. The fan-out package 100 may include a frame 110, a semiconductor chip 200, and a redistribution wiring layer 140. Additionally, the fan-out package 100 may further include outer connection members 400. The antenna structure 300 may include a ground pattern layer 310, a first antenna insulation layer 320, a radiator pattern layer 330, a second antenna insulation layer 340, and a director pattern layer 350 sequentially stacked on one another.

In example embodiments, the fan-out package 100 may include the frame 110 provided on a base substrate and surrounding the semiconductor chip 200. The frame 110 may include core connection wirings 122 which are provided in a fan-out region, i.e., a region outside an area where the semiconductor chip is arranged, to function as an electrical connection path with the semiconductor chip 200. Accordingly, the semiconductor package 10 may be provided as a fan-out panel level package.

Additionally, the semiconductor package 10 may be provided as an Antenna in Package (AiP). For example, the semiconductor chip 200 may include a radio frequency (RF) integrated circuit (RFIC) for wireless communication. The antenna structure 300 may be disposed on the fan-out package 100 to serve as an antenna for transmitting and receiving RF signals.

In example embodiments, the frame 110 may have a first surface 112, e.g., an upper surface, and a second surface 114, e.g., a lower surface, opposite to each other. The frame 110 may have a cavity 116 in a middle region thereof. The cavity 116 may extend from the first surface 112 to the second surface 114 of the frame 110.

The frame 110 may include a plurality of stacked insulation layers, e.g., first and second insulation layers 120a and 120b, and the core connection wirings 122 provided in the insulation layers. For example, the frame 110 may include the first insulation layer 120a and the second insulation layer 120b stacked on the first insulation layer 120a. The core connection wiring 122 may include a first metal wiring 122a, a first contact 122b, a second metal wiring 122c, a second contact 122d, and a third metal wiring 122e. The first metal wiring 122a may be provided in the second surface 114 of the frame 110, i.e., in a lower surface of the first insulation layer 120a, and at least a portion of the first metal wiring 122a may be exposed from the second surface 114. The third metal wiring 112e may be provided in the first surface 112 of the frame 110, i.e., in an upper surface of the second insulation layer 120b, and at least a portion of the third metal wiring 112e may be exposed from the first surface 112. It may be understood that the numbers and arrangements of the insulation layers and the core connection wirings of the frame 110 may not be limited thereto.

The semiconductor chip 200 may be disposed within the cavity 116 of the frame 110. A sidewall of the semiconductor chip 200 may be spaced apart from an inner sidewall of the cavity 116. Accordingly, a gap may be formed between the sidewall of the semiconductor chip 200 and the inner sidewall of the cavity 116.

The semiconductor chip 200 may include a first substrate and chip pads 210 on an active surface, e.g., a first surface facing the redistribution wiring layer 140, of the first substrate. The semiconductor chip 200 may be arranged such that the first surface on which the chip pads 210 are formed faces downward. Accordingly, the chip pads 210 may be exposed from the second surface 114 of the frame 110. The first surface of the semiconductor chip 200 may be coplanar with the second surface 114 of the frame 110. The second surface of the semiconductor chip 200, i.e., a surface opposite to the first surface, may be located on a plane higher than the first surface 112 of the frame 110, e.g., relative to the redistribution wiring layer 140.

The molding layer 130 may be provided on the first surface 112 of the frame 110 to cover the semiconductor chip 200. The molding layer 130 may be formed to fill the gap between the sidewall of the semiconductor chip 200 and the inner sidewall of the cavity 116. Accordingly, a first portion of the molding layer 130 may be formed on the first surface 112 of the frame 110, a second portion of the molding layer 130 may be formed on the inner sidewall of the cavity 116 of the frame 110 to fill the gap, and a third portion of the molding layer 130 may be formed on a second surface of the semiconductor chip 200 opposite to the first surface. For example, the molding layer 130 may include an insulation material, e.g., epoxy resin, a photo imageable dielectric (PID) material, an insulation film, e.g., Ajinomoto Build-up Film (ABF), etc.

In example embodiments, the redistribution wiring layer 140 may be arranged on the second surface 114 of the frame 110, and may have redistribution wirings 152 electrically connected to the chip pads 210 of the semiconductor chip 200 and the core connection wirings 122 of the frame 110, respectively. The redistribution wirings 152 may be provided on the second surface 114 of the frame 110 to function as a front side redistribution wiring.

In particular, the redistribution wiring layer 140 may include a first lower insulation layer 150a provided on the second surface 114 of the frame 110 and having first openings which expose the chip pads 210 of the semiconductor chip 200 and the first metal wiring 122a of the core connection wiring 122. First lower redistribution wirings 152a may be provided on the first lower insulation layer 150a and at least portions of which make contact with the chip pads 210 and the first metal wiring 122a through the first openings.

The redistribution wiring layer 140 may include a second lower insulation layer 150b provided on the first lower insulation layer 150a and having second openings which expose the first lower redistribution wirings 152a. Second lower redistribution wirings 152b may be provided on the second lower insulation layer 150b and at least portions of which make contact with the first lower redistribution wirings 152a through the second openings.

The redistribution wiring layer 140 may include a third lower insulation layer 150c provided on the second lower insulation layer 150b and having third openings which expose the second lower redistribution wirings 152b. Third lower redistribution wirings 152c may be provided on the third lower insulation layer 150c and at least portions of which make contact with the second lower redistribution wirings 152b through the third openings.

The redistribution wiring layer 140 may include a protective layer on the third lower insulation layer 150c to expose at least a portion of the third lower redistribution wiring 152c. In this case, the portion of the third lower redistribution wiring 152c may function as a landing pad, i.e., a package pad.

For example, the first to third lower insulation layers 150a to 150c may include a polymer layer, a dielectric layer, etc. The redistribution wirings 152 may include, e.g., aluminum (Al), copper (Cu), tin (Sn), nickel (Ni), gold (Au), platinum (Pt) or an alloy thereof.

Thus, the redistribution wiring layer 140 may be provided on the second surface 114 of the frame 110 and may have the redistribution wirings 152 electrically connected to the chip pads 210 and the core connection wirings 122, respectively. The redistribution wiring layer 140 may cover the second surface 114 of the frame 110 in a region outside the semiconductor chip 200. Some of the redistribution wirings 152 may electrically connect the semiconductor chip 200 and the core connection wiring 122 of the frame 110. It may be understood that the number, sizes, arrangements, etc. of the lower insulation layers of the redistribution wirings are exemplarily illustrated, and thus, it may not be limited thereto.

The outer connection members 400 may be disposed on the package pads on an outer surface of the redistribution wiring layer 140. For example, the outer connection member 400 may include a solder ball. For example, the solder ball may have a diameter of 300 μm to 500 μm. The semiconductor package 10 may be mounted on a module substrate via the solder balls to constitute a memory module. The semiconductor package 10 may be electrically connected to an external device, e.g., a modem, through the solder balls to transmit and receive data or voice signals.

Thus, the fan-out package 100 as fan-out panel level package may include the frame 110 provided in the region outside the semiconductor chip 200 and the redistribution wiring layer 140 covering the second surface 114 of the frame 110. In example embodiments, the antenna structure 300 may be provided as a patch antenna adhered on the fan-out package 100.

As illustrated in FIG. 1, the antenna structure 300 may include the ground pattern layer 310, the radiator pattern layer 330, and the director pattern layer 350 provided as backside redistribution wirings on the first surface 112 of the frame 110. The first antenna insulation layer 320 may be interposed between the ground pattern layer 310 and the radiator pattern layer 330. The second antenna insulation layer 340 may be interposed between the radiator pattern layer 330 and the director pattern layer 350.

As illustrated in FIGS. 1 and 2A, the ground pattern layer 310 may include a ground pattern provided on the molding layer 130 to function as a shield layer. The ground pattern layer 310 may include a plurality of via holes 311. A first transmission wiring 312b may be formed within the via hole 311. The first transmission wiring 312b may be electrically connected to a first transmission contact 312a formed in the molding layer 130. The first transmission contact 312a may be electrically connected to the third metal wiring 122e of the core connection wiring 122.

Thus, the first transmission contact 312a and the first transmission wiring 312b may be electrically connected to the core connection wiring 122. The ground pattern layer 310 may be electrically insulated from the core connection wiring 122.

The first antenna insulation layer 320 may be provided on the molding layer 130 to cover the ground pattern layer 310, e.g., the first antenna insulation layer 320 may contact a top surface of the molding layer 130 and completely surround the ground pattern layer 310. The first antenna insulation layer 320 may include an insulation material having a first thermal expansion coefficient (coefficient of linear expansion). The insulation material may include, e.g., Ajinomoto Build-up Film (ABF) film, polyimide film, epoxy resin, etc. The first thermal expansion coefficient may be within a range of about 30 ppm (part per million)/° C. to about 50 ppm/° C.

The first antenna insulation layer 320 may be formed to have a first thickness T1. The first thickness T1 may be within a range of about 100 μm to about 150 μm. The first antenna insulation layer 320 may have a dissipation factor of about 0.020 to about 0.030 in a frequency of about 28 GHz to about 60 GHz.

As illustrated in FIG. 2B, a radiator pattern layer 330 may be provided on the first antenna insulation layer 320. The radiator pattern layer 330 may have a radiator antenna pattern 332 and a radiator ground pattern 334. The radiator pattern layer 330 may be electrically connected to a second transmission contact 312c formed in the first antenna insulation layer 320. The first transmission contact 312a, the first transmission wiring 312b, and the second transmission contact 312c may be provided as a transmission line 312. Accordingly, the radiator pattern layer 330 may be electrically connected to the core connection wiring 122 by the transmission line 312.

As illustrated in FIGS. 1 and 2C, a second antenna insulation layer 340 may be provided on the radiator pattern layer 330, and the director pattern layer 350 may be formed on an upper surface of the second antenna insulation layer 340. The second antenna insulation layer 340 having the director pattern layer 350 formed thereon may be adhered on the radiator pattern layer 330 in the form of a core substrate. A first insulation layer 362 and a second insulation layer 360 may be provided on the upper surface and a lower surface of the second antenna insulation layer 340, respectively.

The director pattern layer 350 may have a director antenna pattern 352 and a director ground pattern 354. The director pattern layer 350 may be electrically insulated from the radiator pattern layer 330.

In example embodiments, the second antenna insulation layer 340 may include an insulation material having a second thermal expansion coefficient. The insulation material may be formed using, e.g., polypropylene glycol (PPG). The second antenna insulation layer 340 having the director pattern layer 350 formed thereon may include a material of copper clad laminates (CCL) using prepreg.

The second thermal expansion coefficient of the second antenna insulation layer 340 may be smaller than the first thermal expansion coefficient of the first antenna insulation layer 320. For example, the second thermal expansion coefficient may be ⅓ to ¼ of the first thermal expansion coefficient. The second thermal expansion coefficient may be within a range of about 5 ppm/° C. to about 15 ppm/° C.

The second antenna insulation layer 340 may include the same material as the frame 110. The second thermal expansion coefficient of the second antenna insulation layer 340 may be substantially the same as the thermal expansion coefficient of the frame 110.

The second antenna insulation layer 340 may be formed to have a second thickness T2. The second thickness T2 of the second antenna insulation layer 340 may be greater than the first thickness T1 of the first antenna insulation layer 320. For example, the second thickness T2 may be at least twice the first thickness T1. For example, the second thickness T2 may be within a range of about 150 μm to about 350 μm. In addition, the second antenna insulation layer 340 may have a dielectric loss (Df, dissipation factor) of about 0.001 to about 0.005 at about 28 GHz to about 60 GHz.

In example embodiments, the transmission line 312 may electrically connect the radiator pattern layer 330 of the antenna structure 300 and the core connection wiring 122. The transmission lines 312 electrically connected to the semiconductor chip 200 may be vertically stacked through the via hole 311 of the ground pattern layer 310 to match antenna impedance.

As mentioned above, the antenna structure 300 may be disposed on and separated from the frame 110, in which the semiconductor chip 200 is mounted, by the ground pattern layer 310. The second thermal expansion coefficient of the second antenna insulation layer 340 may be smaller than the first thermal expansion coefficient of the first antenna insulation layer 320, and the second thermal expansion coefficient of the second antenna insulation layer 340 may be the same as or similar to the thermal expansion coefficient of the frame 110. The second thickness T2 of the second antenna insulation layer 340 may be greater than the first thickness T1 of the first antenna insulation layer 320.

Accordingly, warpage due to a difference in thermal expansion coefficient between the fan-out package 100 and the antenna structure 300 may be prevented, and the thickness of the antenna insulation layer may be increased. Thus, antenna radiation gain may be improved.

Hereinafter, a method of manufacturing the semiconductor package in FIG. 1 will be explained, with reference to FIGS. 3 to 15.

Figure 10:
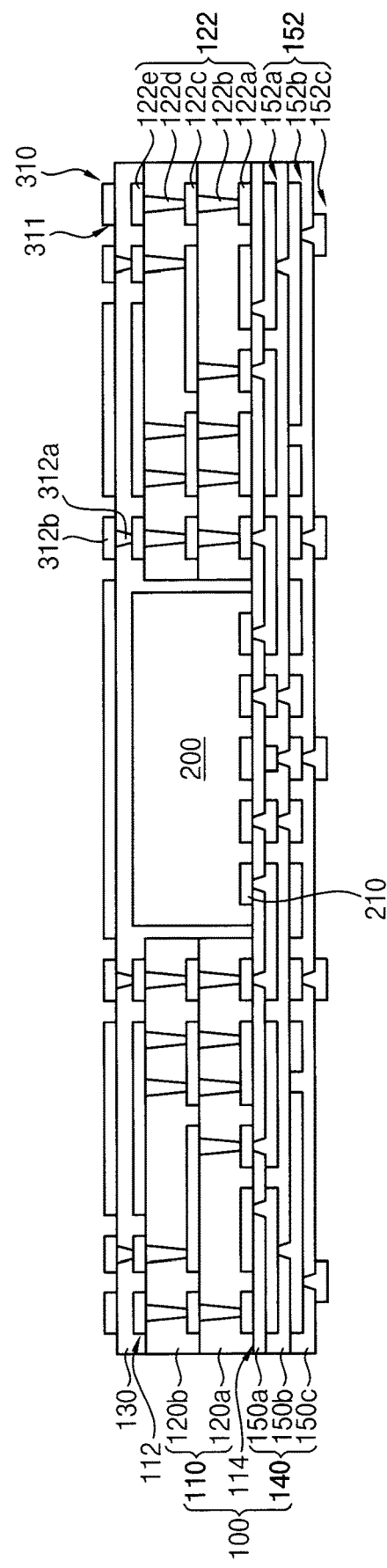
Figure 11:
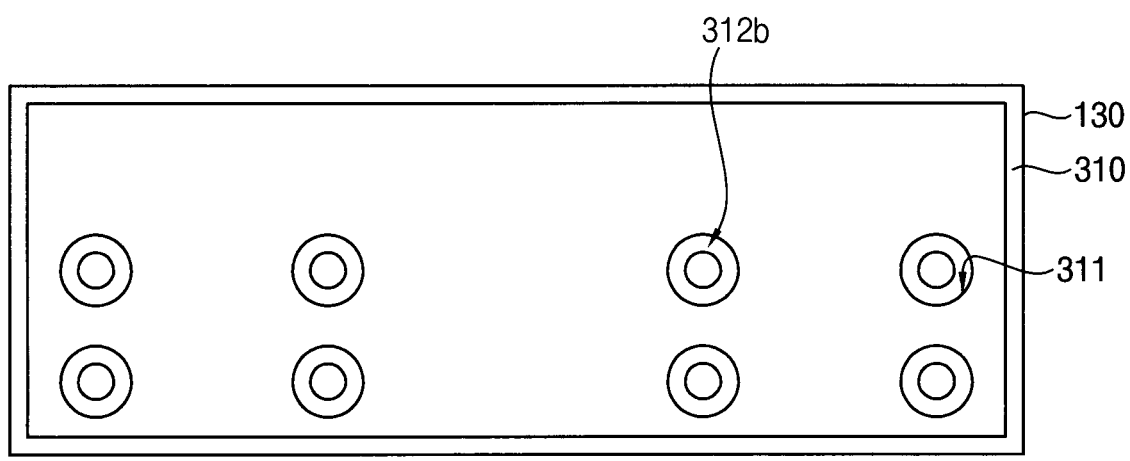

FIGS. 3 to 15 are views illustrating stages in a method of manufacturing a semiconductor package in accordance with example embodiments. FIGS. 3, 5 to 10, 12 and 14 are cross-sectional views illustrating stages in the method of manufacturing a semiconductor package in accordance with example embodiments. FIG. 4 is a sectional view taken along the line A-A' in FIG. 3, as viewed in a top view, FIG. 11 is a plan view of FIG. 10, and FIG. 15 is a plan view of FIG. 14.

Figure 3:
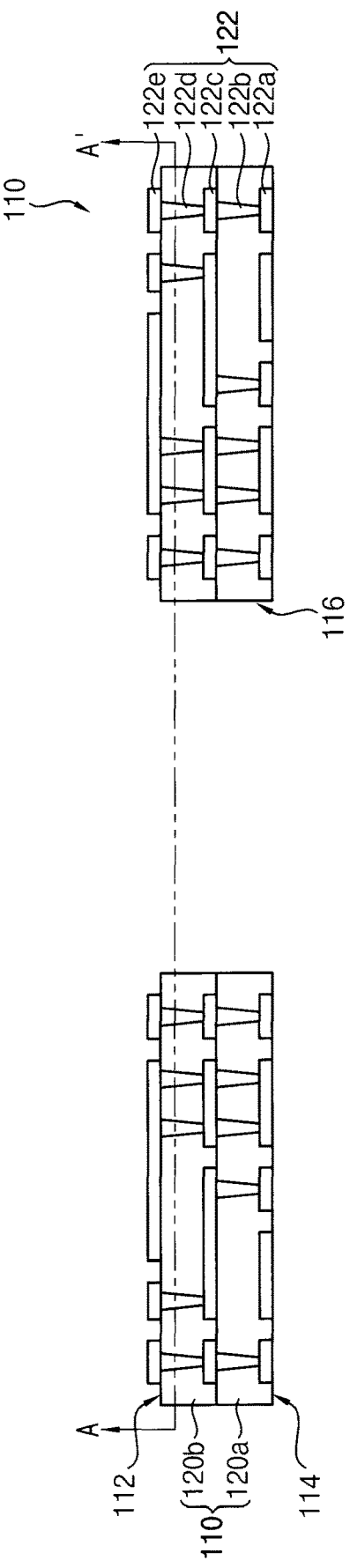
FIGS. 3 to 15 are views illustrating stages in a method of manufacturing a semiconductor package in accordance with example embodiments.
Figure 4:
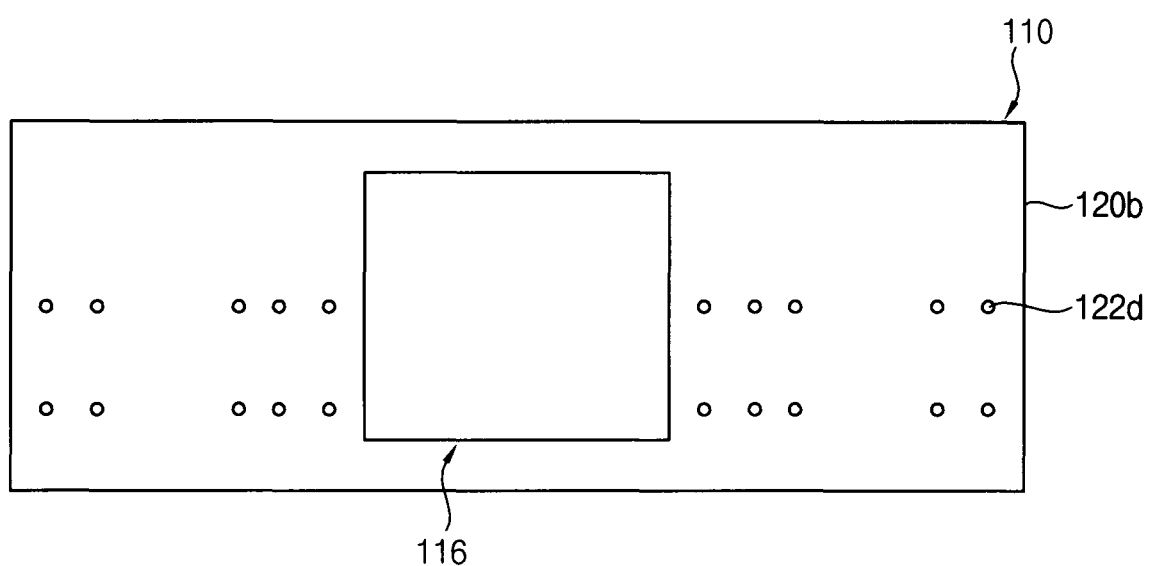

Referring to FIGS. 3 and 4, the frame 110 having the cavity 116 may be adhered on a barrier tape 20. In example embodiments, the frame 110 may be used as a support frame for electrical connection on which a plurality of semiconductor chips is arranged to manufacture semiconductor packages having a fan-out panel level package configuration.

The frame 110 may have the first surface 112 and the second surface 114 opposite to each other. The frame 110 may have the cavity 116 in a middle region thereof. As described later, the cavity 116 may have an area for receiving the semiconductor chip 200.

The frame 110 may include the plurality of stacked insulation layers 120a, 120b and core connection wirings 122 provided in the insulation layers. The core connection wirings 122 may be provided to penetrate through the frame 110 from the first surface 112 to the second surface 114 of the frame 110 to function as electrical connection paths. That is, the core connection wirings 122 may be provided in a fan-out region outside an area where the semiconductor chip (die) is disposed to be used for electrical connection with the semiconductor chip mounted therein.

For example, the frame 110 may include the first insulation layer 120a and the second insulation layer 120b stacked on the first insulation layer 120a. The core connection wiring 122 may include the first metal wiring 122a, the first contact 122b, the second metal wiring 122c, the second contact 122d, and the third metal wiring 122e. The first metal wiring 122a may be provided in the second surface 114 of the frame 110, i.e., a lower surface of the first insulation layer 120a, and at least a portion of the first metal wiring 122a may be exposed from the second surface 114. The third metal wiring 122e may be provided in the first surface 112 of the frame 110, i.e., an upper surface of the second insulation layer 120b, and at least a portion of the third metal wiring 122e may be exposed from the first surface 112. It may be understood that the numbers and arrangements of the insulation layers and the core connection wirings may not be limited thereto.

The frame 110 may be arranged on the barrier tape 20. The second surface 114 of the frame 110 may be adhered on the barrier tape 20. The barrier tape 20 may have a panel shape. For example, dozens or hundreds of dies may be arranged in the cavities 116 of the frame 110, respectively. As described later, a singulation process may be performed to saw the frame 110 to complete a fan-out panel level package.

Figure 5:
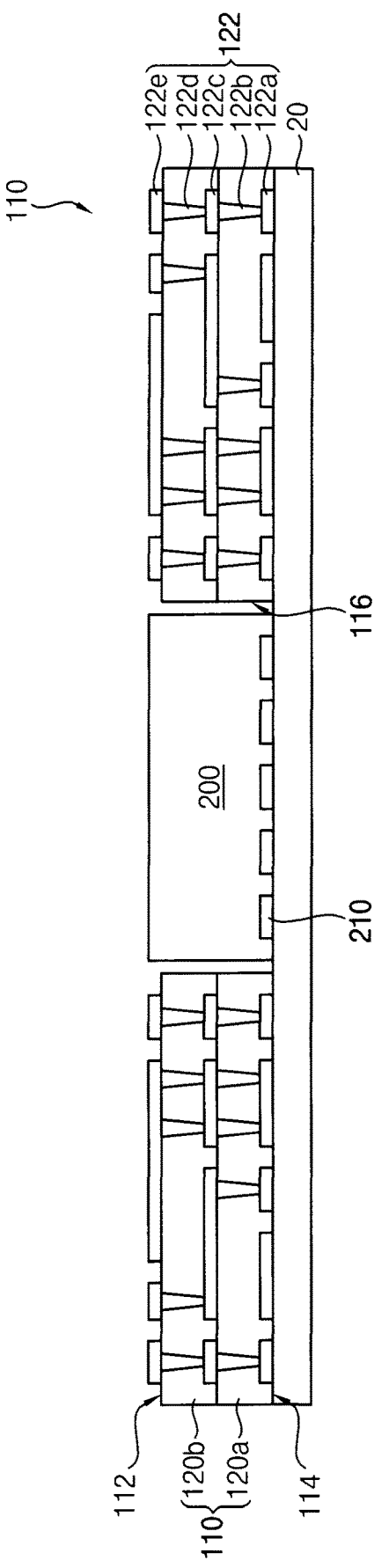
Figure 6:
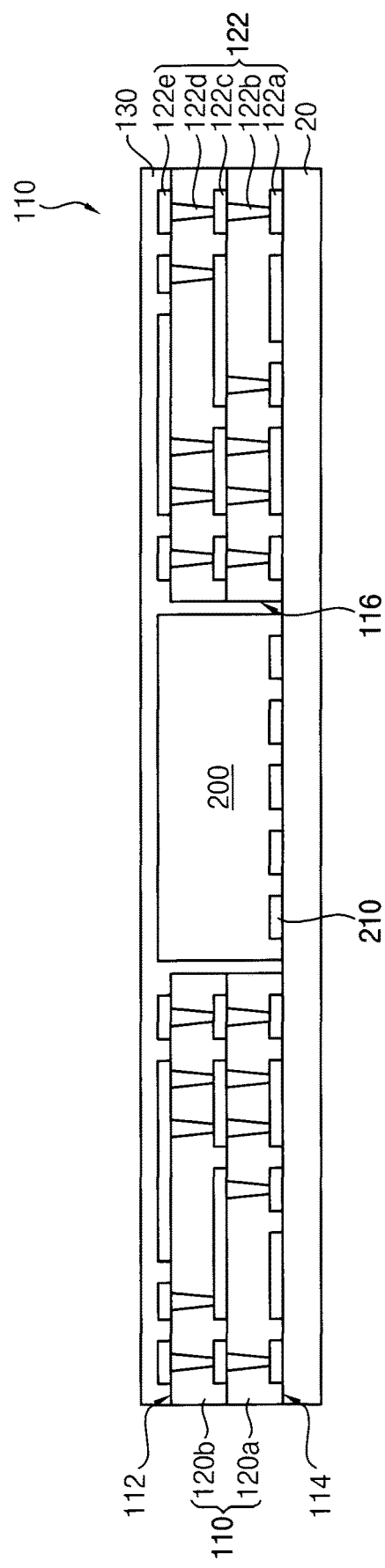

Referring to FIGS. 5 and 6, the semiconductor chip 200 may be arranged within the cavity 116 of the frame 110. The molding layer 130 may be formed on the first surface 112 of the frame 110 to cover the semiconductor chip 200.

The semiconductor chip 200 may be disposed within the cavity 116 of the frame 110. A sidewall of the semiconductor chip 200 may be spaced apart from an inner sidewall of the cavity 116. Accordingly, a gap may be formed between the sidewall of the semiconductor chip 200 and the inner sidewall of the cavity 116.

The semiconductor chip 200 may include a first substrate and chip pads 210 on an active surface, i.e., a first surface of the first substrate. The semiconductor chip 200 may be arranged such that the first surface on which the chip pads 210 are formed faces downward. For example, the semiconductor chip 200 may include an RFIC for wireless communication.

The molding layer 130 may include an insulation material, e.g., epoxy resin, a photo imageable dielectric (PID) material, an insulation film, e.g., ABF, etc. The molding layer 130 may be formed on the first surface 112 of the frame 110 to cover the semiconductor chip 200. The molding layer 130 may be formed to fill the gap between the sidewall of the semiconductor chip 200 and the inner sidewall of the cavity 116. Accordingly, a first portion of the molding layer 130 may be formed on the first surface 112 of the frame 110, a second portion of the molding layer 130 may be formed on the inner sidewall of the cavity 116 of the frame 110 to fill the gap, and a third portion of the molding layer 130 may be formed on a second surface of the semiconductor chip 200 opposite to the first surface.

Figure 7:
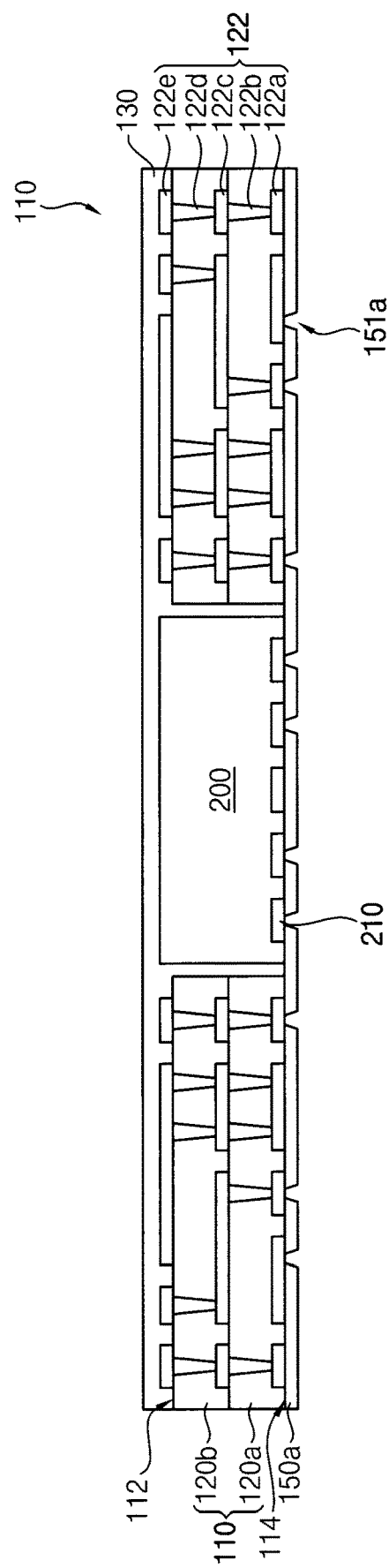
Figure 8:
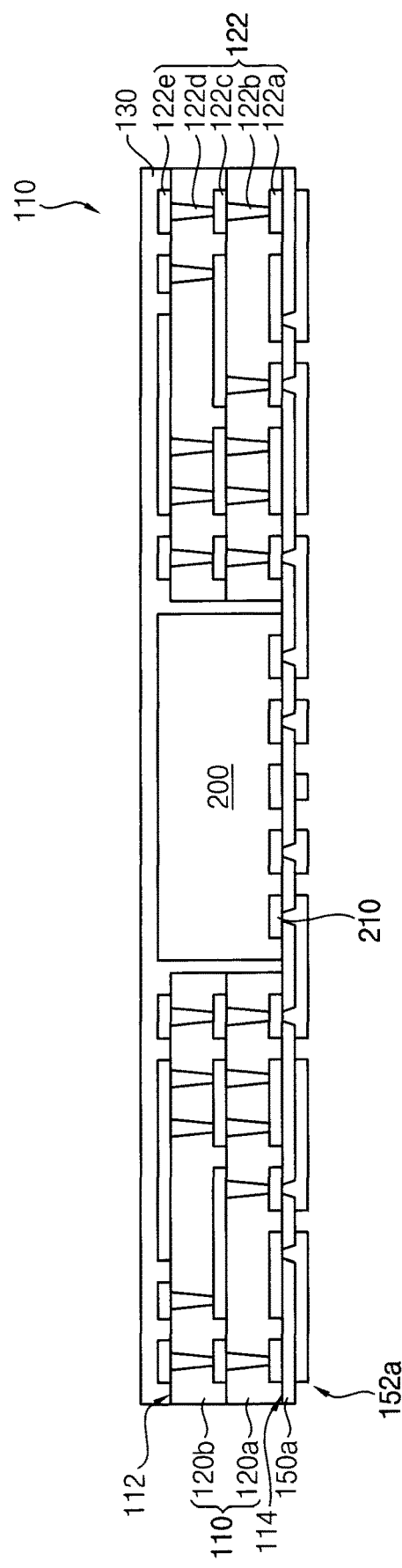
Figure 9:
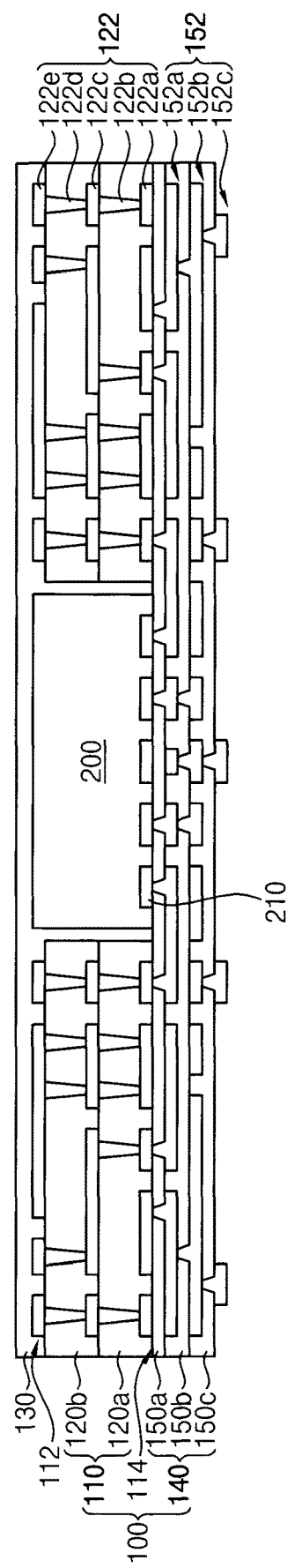

Referring to FIGS. 7 to 9, the redistribution wiring layer 140 having the redistribution wirings 152 electrically connected to the chip pads 210 of the semiconductor chip 200 and the core connection wirings 122, respectively, may be formed on the second surface 114 of the frame 110.

As illustrated in FIG. 7, after the first lower insulation layer 150a is formed on the second surface 114 of the frame 110, the first lower insulation layer 150a may be patterned to form first openings 151a which expose the chip pads 210 of the semiconductor chip 200 and the first metal wiring 122a of the core connection wiring 122, respectively. For example, the first lower insulation layer 150a may include a polymer layer, a dielectric layer, etc. The first lower insulation layer 150a may be formed by a vapor deposition process, a spin coating process, etc.

As illustrated in FIG. 8, the first lower redistribution wirings 152a may be formed on the first lower insulation layer 150a to make contact with the chip pads 210 and the first metal wiring 122a through the first openings 151a, respectively. The first lower redistribution wiring 152a may be formed by forming a seed layer on a portion of the first lower insulation layer 150a and in the first opening 151a, patterning the seed layer and performing an electro plating process. Accordingly, at least a portion of the first lower redistribution wiring 152a may make contact with the first metal wiring 122a through the first opening. For example, the first lower redistribution wiring 152a may include aluminum (Al), copper (Cu), tin (Sn), nickel (Ni), gold (Au), platinum (Pt) or an alloy thereof.

As illustrated in FIG. 9, after the second lower insulation layer 150b is formed on the first lower insulation layer 150a to cover the first lower redistribution wirings 152a, the second lower insulation layer 150b may be patterned to form second openings which expose the first lower redistribution wirings 152a, respectively. The second lower redistribution wirings 152b may be formed on the second lower insulation layer 150b to make contact with the first lower redistribution wirings 152a through the second openings, respectively.

Similarly, after the third lower insulation layer 150c is formed on the second lower insulation layer 150b to cover the second lower redistribution wirings 152b, the third lower insulation layer 150c may be patterned to form third openings which expose the second lower redistribution wirings 152b, respectively. The third lower redistribution wirings 152c may be formed on the third lower insulation layer 150c to make contact with the second lower redistribution wirings 152b through the third openings, respectively.

A protective layer pattern may be further formed on the third lower insulation layer 150c to expose at least a portion of the third lower redistribution wiring 152c. In this case, the portion of the third lower redistribution wiring 152c may function as a landing pad, i.e., a package pad.

Thus, the redistribution wiring layer 140 having the redistribution wirings 152 electrically connected to the chip pads 210 and the core connection wirings 122, respectively, may be formed on the second surface 114 of the frame 110. The redistribution wiring layer 140 may cover the second surface 114 of the frame 110 in a region outside the semiconductor chip 200. Some of the redistribution wirings 152 may electrically connect the semiconductor chip 200 and the core connection wiring 122 of the frame 110. It may be understood that the number, sizes, arrangements, etc. of the lower insulation layers of the redistribution wirings are exemplarily illustrated, and thus, it may not be limited thereto.

Referring to FIGS. 10 to 15, the antenna structure 300 may be formed on the first surface 112 of the frame 110.

As illustrated in FIGS. 10 and 11, the ground pattern layer 310 may be formed on the molding layer 130 on the first surface 112 of the frame 110. For example, as illustrated in FIG. 10, the ground pattern layer 310 may include the via holes 311 on the first surface 112.

In example embodiments, a conductive layer may be formed on the molding layer 130, e.g., to cover an entire top surface of the molding layer 130, followed by patterning the conductive layer to form the ground pattern layer 310. The ground pattern layer 310 may have the via holes 311. The first transmission wiring 312b may be formed within the via hole 311, such that the first transmission wiring 312b may be electrically connected to the first transmission contact 312a formed in the molding layer 130. The first transmission contact 312a may be electrically connected to the third metal wiring 122e of the core connection wiring 122.

Thus, the first transmission contact 312a and the first transmission wiring 312b may be electrically insulated from the ground pattern layer 310. Additionally, the first transmission contact 312a and the first transmission wiring 312b may be electrically connected to the core connection wiring 122.

Figure 12:
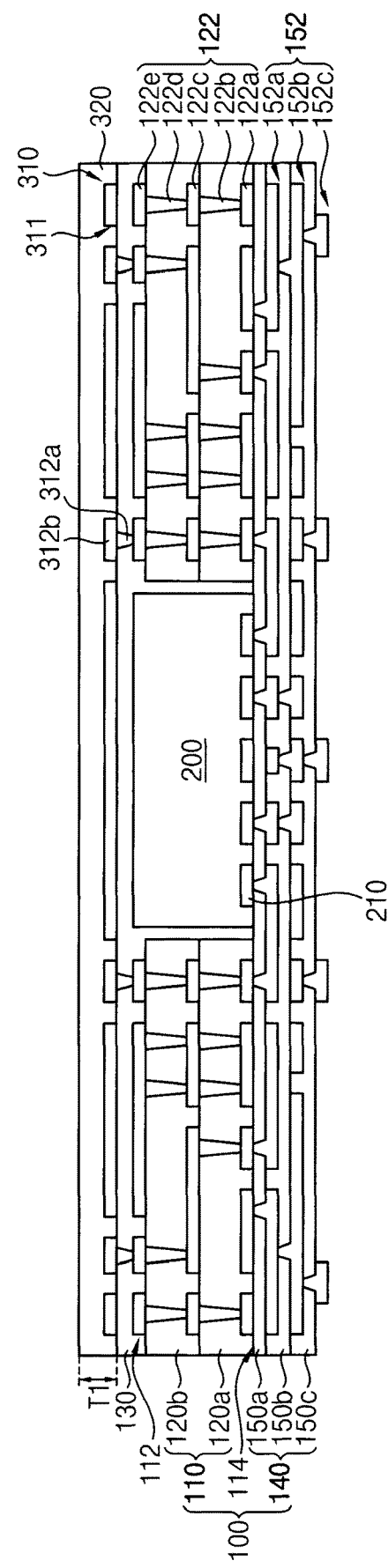

As illustrated in FIG. 12, the first antenna insulation layer 320 may be formed on the molding layer 130 to cover the ground pattern layer 310. In example embodiments, the first antenna insulation layer 320 may include an insulation material having a first thermal expansion coefficient. The insulation material may include, e.g., ABF film, polyimide film, epoxy resin, etc. The first thermal expansion coefficient may be within a range of about 30 ppm/° C. to about 50 ppm/° C.

The first antenna insulation layer 320 may be formed to have the first thickness T1. The first thickness T1 may be within a range of about 100 µm to about 150 µm. The first antenna insulation layer 320 may have a dissipation factor of about 0.020 to about 0.030 in a frequency of about 28 GHz to about 60 GHz.

Figure 13:
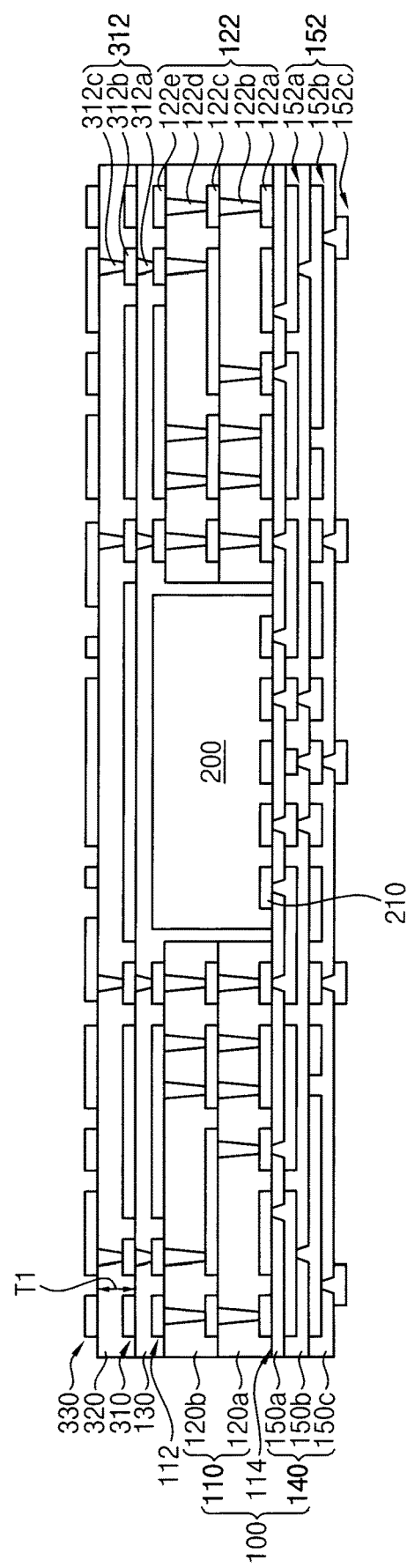

As illustrated in FIG. 13, the radiator pattern layer 330 may be formed on the first antenna insulation layer 320. The radiator pattern layer 330 may be electrically connected to the second transmission contact 312c formed in the first antenna insulation layer 320. The first transmission contact 312a, the first transmission wiring 312b, and the second transmission contact 312c may be provided as the transmission line 312. Accordingly, the radiator pattern layer 330 may be electrically connected to the core connection wiring 122 by the transmission line 312.

Figure 14:
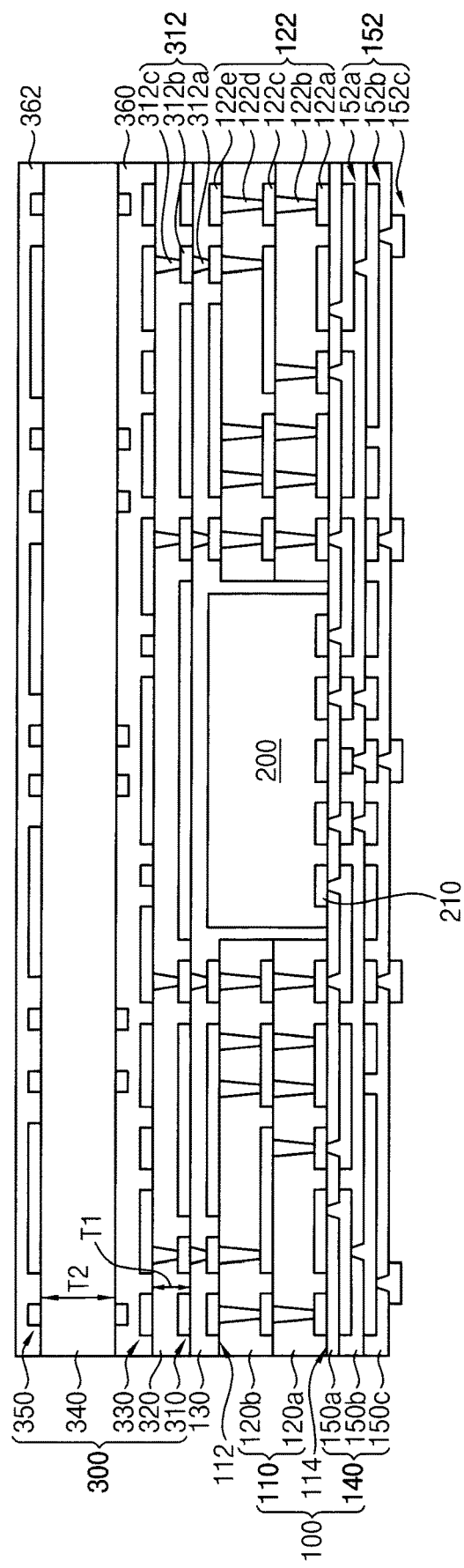
Figure 15:
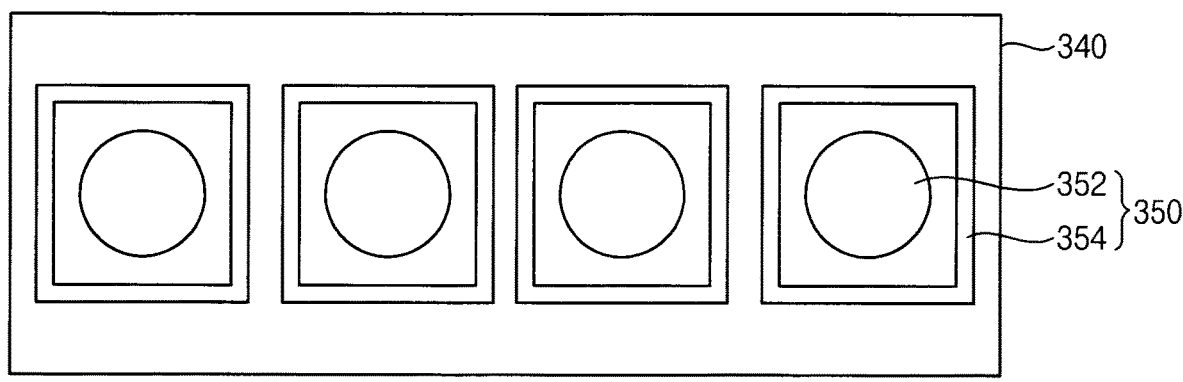

As illustrated in FIGS. 14 and 15, the second antenna insulation layer 340 may be formed on the radiator pattern layer 330. The director pattern layer 350 may be formed on an upper surface of the second antenna insulation layer 340. The second antenna insulation layer 340 having the director pattern layer 350 formed thereon may be adhered on the radiator pattern layer 330 in the form of a core substrate.

The director pattern layer 350 may have the director antenna pattern 352 and the director ground pattern 354. The director pattern layer 350 may be electrically insulated from the radiator pattern layer 330.

In example embodiments, the second antenna insulation layer 340 may include an insulation material having a second thermal expansion coefficient. The insulation material may include polypropylene glycol (PPG). The second antenna insulation layer 340 having the director pattern layer 350 formed thereon may be formed of a copper clad laminates (CCL) using prepreg.

The second thermal expansion coefficient of the second antenna insulation layer 340 may be smaller than the first thermal expansion coefficient of the first antenna insulation layer 320. For example, the second thermal expansion coefficient may be ⅓ to ¼ of the first thermal expansion coefficient. The second thermal expansion coefficient may be within a range of about 5 ppm/° C. to about 15 ppm/° C.

The second antenna insulation layer 340 may include the same material as the frame 110. The second thermal expansion coefficient of the second antenna insulation layer 340 may be substantially the same as the thermal expansion coefficient of the frame 110.

The second antenna insulation layer 340 may be formed to have the second thickness T2. The second thickness T2 of the second antenna insulation layer 340 may be greater than the first thickness T1 of the first antenna insulation layer 320. For example, the second thickness T2 may be at least twice the first thickness T1. For example, the second thickness T2 may be within a range of about 150 µm to about 350 µm. In addition, the second antenna insulation layer 340 may have a dielectric loss (Df, dissipation factor) of about 0.001 to about 0.005 at about 28 GHz to about 60 GHz.

Figure 16:
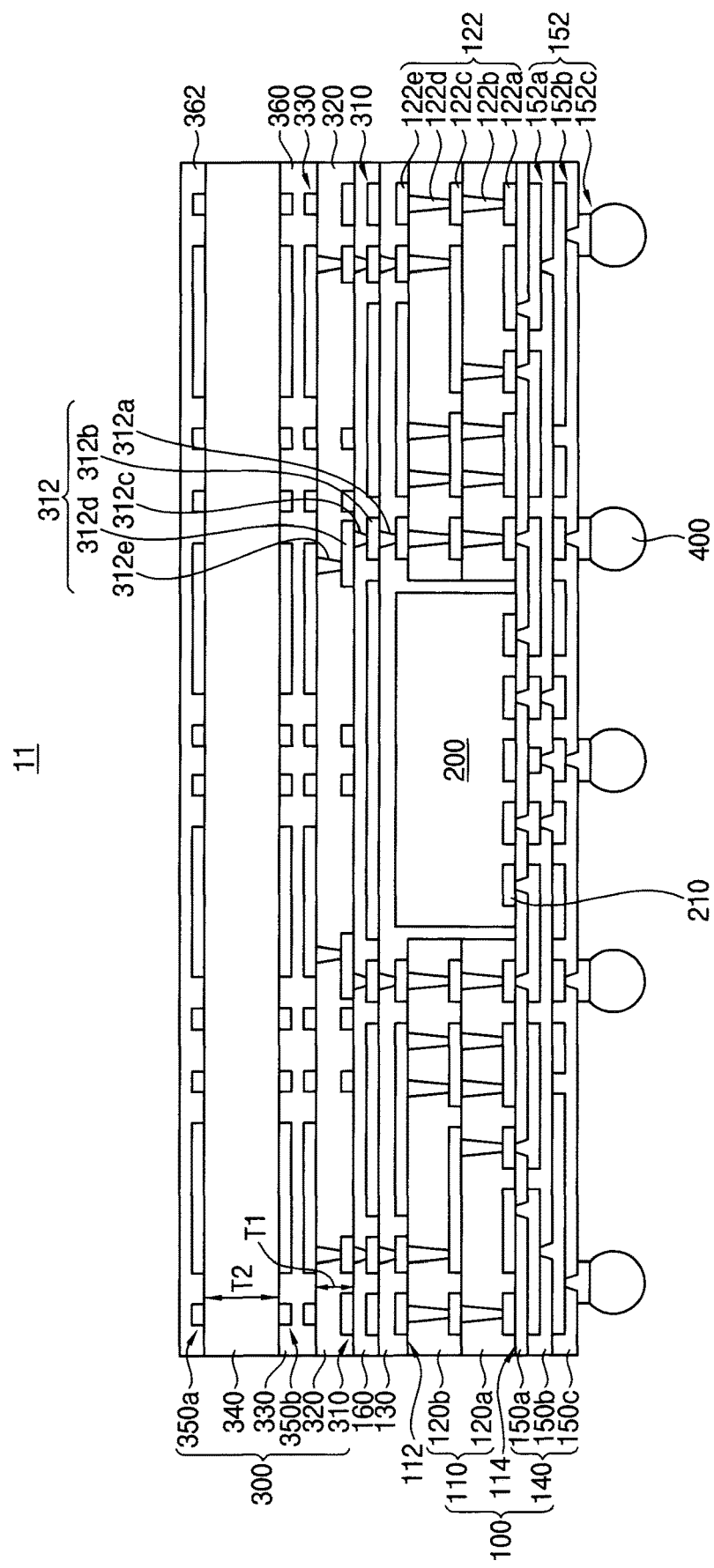
FIG. 16 is a cross-sectional view illustrating a semiconductor package in accordance with example embodiments.

FIG. 16 is a cross-sectional view illustrating a semiconductor package in accordance with example embodiments. The semiconductor package may be substantially the same as or similar to the semiconductor package described with reference to FIG. 1 except for a configuration of an antenna structure. Thus, same reference numerals will be used to refer to the same or like elements and any further repetitive explanation concerning the above elements will be omitted.

Referring to FIG. 16, an antenna structure 300 of a semiconductor package 11 may include antenna patterns, i.e., the ground pattern layer 310, the radiator pattern layer 330, and a director pattern layer 350a, provided as backside redistribution wirings on the first surface 112 of the frame 110. The first antenna insulation layer 320 may be interposed between the ground pattern layer 310 and the radiator pattern layer 330. The second antenna insulation layer 340 may be interposed between the radiator pattern layer 330 and the director pattern layer 350a.

The ground pattern layer 310 may be provided on the molding layer 130, and the first antenna insulation layer 320 may be provided on a first upper insulation layer 160 to cover the ground pattern layer 310.

The first transmission contact 312a, the first transmission wiring 312b, the second transmission contact 312c, the second transmission wiring 312d, and the third transmission contact 312e may be provided as the transmission line 312. Accordingly, the radiator pattern layer 330 may be electrically connected to the core connection wiring 122 by the transmission line 312.

The second antenna insulation layer 340 may be provided on the radiator pattern layer 330. The first director pattern layer 350a may be provided on an upper surface of the second antenna insulation layer 340, and a second director pattern layer 350b may be provided on a lower surface of the second antenna insulation layer 340. The second antenna insulation layer 340 having the first and second director pattern layers 350a and 350b formed thereon may be adhered on the radiator pattern layer 330 in the form of a core substrate.

The first and second director pattern layers 350a and 350b may have shapes corresponding to each other, e.g., the first and second director pattern layers 350a and 350b may completely overlap each other along a vertical direction. Additionally, the radiator pattern layer 330 may have a shape corresponding to, e.g., overlapping, the first and second director pattern layers 350a, 350b.

Hereinafter, a method of manufacturing the semiconductor package in FIG. 16 will be explained.

Figure 17:
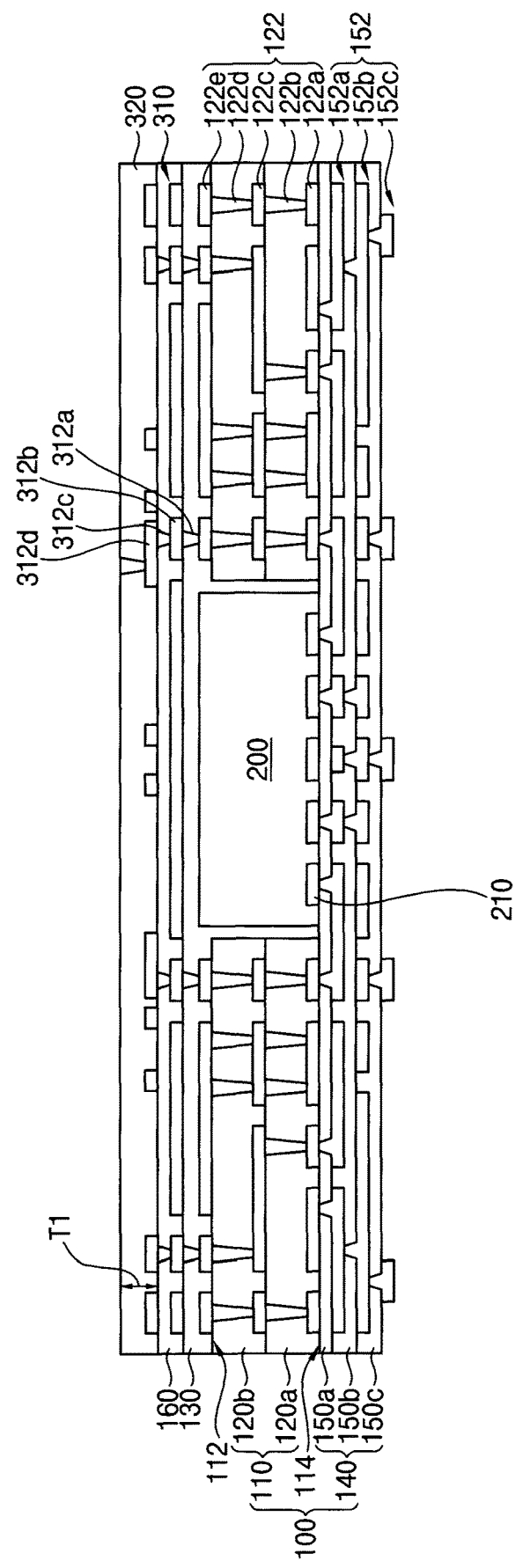
FIGS. 17 to 19 are cross-sectional views illustrating stages in a method of manufacturing a semiconductor package in accordance with example embodiments.
Figure 18:
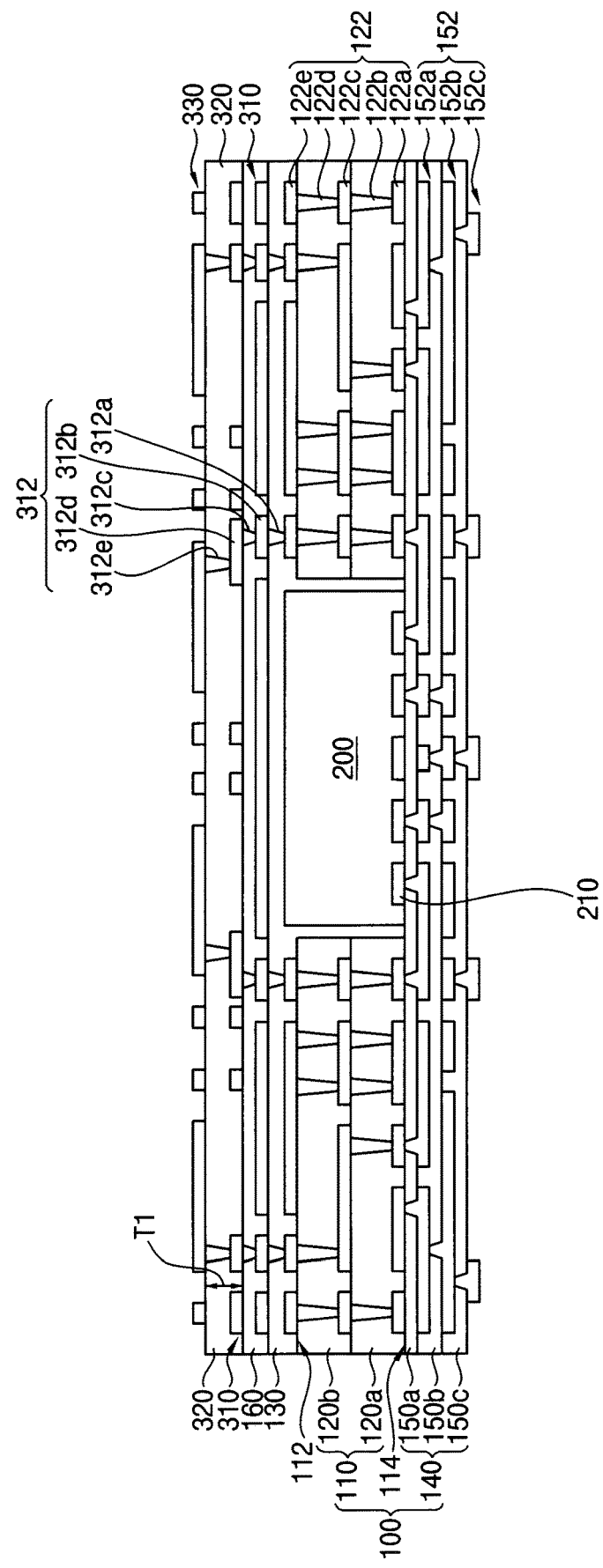
Figure 19:
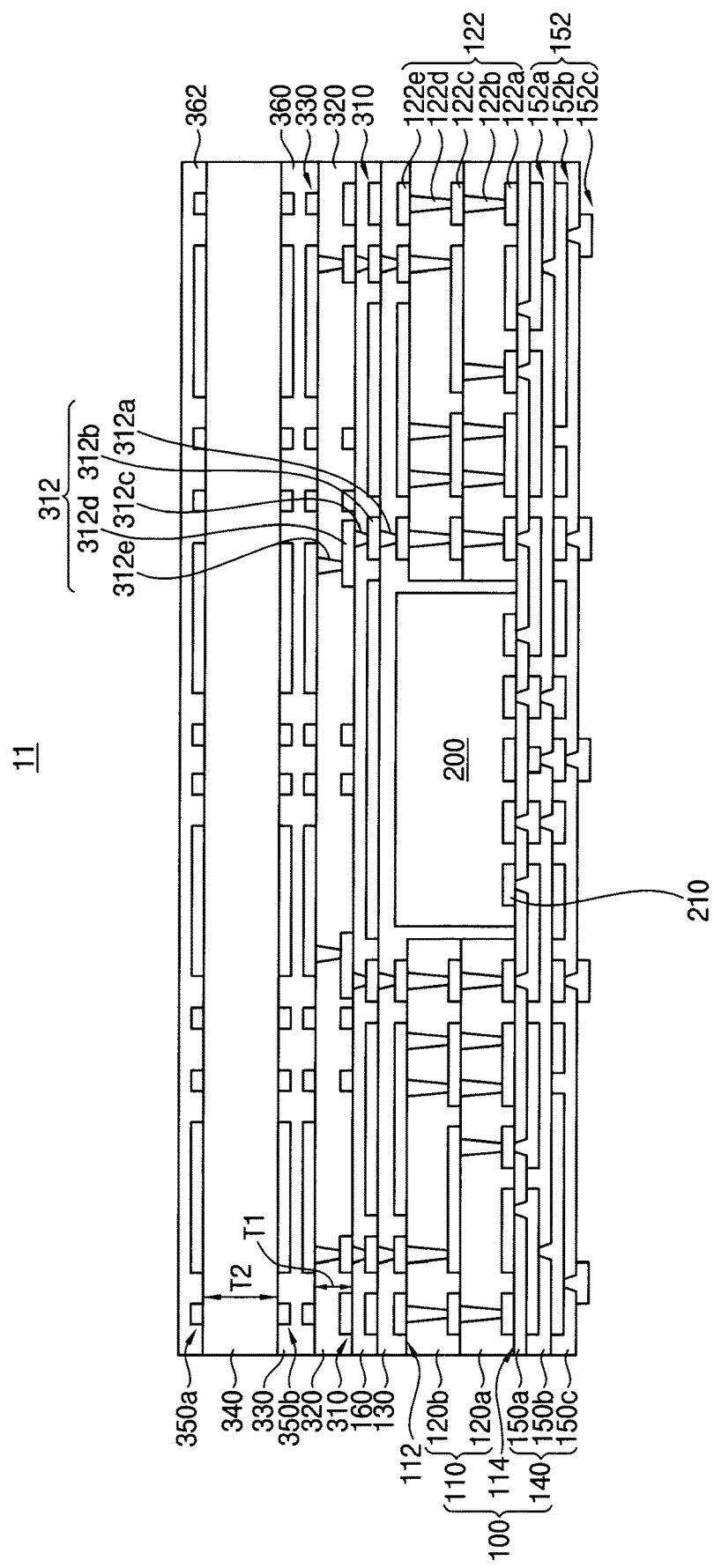

FIGS. 17 to 19 are cross-sectional views illustrating a method of manufacturing a semiconductor package in accordance with example embodiments.

Referring to FIG. 17, first, processes the same as or similar to the processes described with reference to FIGS. 3 to 10 may be performed to form the ground pattern layer 310 on the molding layer 130 on the first surface 112 of the frame 110. Then, the first upper insulation layer 160 and the first antenna insulation layer 320 may be formed on the molding layer 130 to cover the ground pattern layer 310.

In example embodiments, the first upper insulation layer 160 may be formed by a vapor deposition process, a spin coating process, etc. The first upper insulation layer 160 may include a polymer layer, a dielectric layer, etc. Alternatively, the first upper insulation layer 160 may include a photo imageable dielectric (PID) material.

After the first upper insulation layer 160 is patterned to form the second transmission contact 312c, the second transmission wiring 312d as an upper redistribution wiring may be formed on the first upper insulation layer 160. The first antenna insulation layer 320 may be formed on the first upper insulation layer 160 to cover the second transmission wiring 312d. The first antenna insulation layer 320 may be formed to have the first thickness T1. The first thickness T1 may be within a range of about 100 μm to about 150 μm.

Referring to FIG. 18, a radiator pattern layer 330 may be formed on the first antenna insulation layer 320.

The radiator pattern layer 330 may be electrically connected to the third transmission contact 312e formed in the first antenna insulation layer 320. The first transmission contact 312a, the first transmission wiring 312b, the second transmission contact 312c, the second transmission wiring 312d, and the third transmission contact 312e may be provided as the transmission line 312. Accordingly, the radiator pattern layer 330 may be electrically connected to the core connection wiring 122 by the transmission line 312.

Referring to FIG. 19, the second antenna insulation layer 340 may be formed on the radiator pattern layer 330. The first director pattern layer 350a may be formed on an upper surface of the second antenna insulation layer 340, and the second director pattern layer 350b may be formed on a lower surface of the second antenna insulation layer 340. The second antenna insulation layer 340 having the first and second director pattern layers 350a an 350b formed thereon may be adhered on the radiator pattern layer 330 in the form of a core substrate.

The first and second director pattern layers 350a and 350b may have shapes corresponding to each other. Additionally, the radiator pattern layer 330 may have a shape corresponding to the first and second director pattern layers 350a and 350b.

Figure 20:
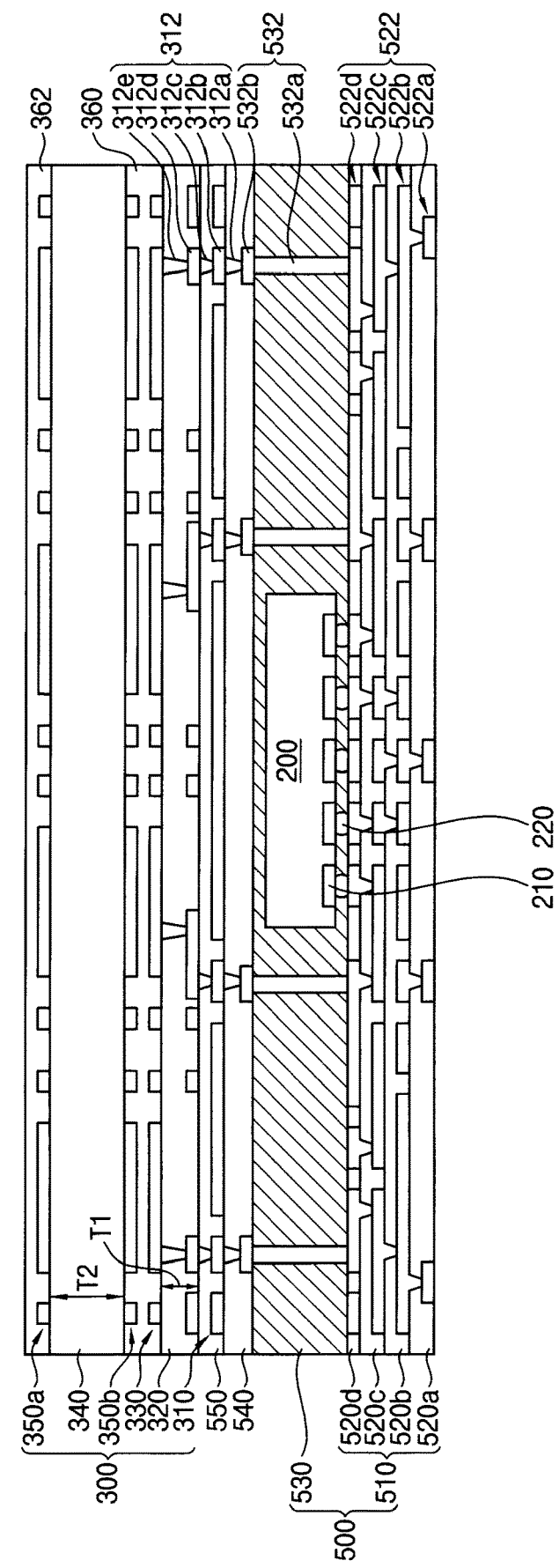
FIG. 20 is a cross-sectional view illustrating a semiconductor package in accordance with example embodiments.

FIG. 20 is a cross-sectional view illustrating a semiconductor package in accordance with example embodiments. The semiconductor package may be substantially the same as or similar to the semiconductor package described with reference to FIG. 16, except for an upper redistribution wiring layer and an additional second package. Thus, same reference numerals will be used to refer to the same or like elements and any further repetitive explanation concerning the above elements will be omitted.

Referring to FIG. 20, a fan-out package 500 of a semiconductor package 12 may include a mold substrate 530 as a frame surrounding a semiconductor chip 200. The fan-out package 500 may include a redistribution wiring layer 510, the semiconductor chip 200 arranged on the redistribution wiring layer 510 and the mold substrate 530 on the redistribution wiring layer to cover the semiconductor chip 200. The mold substrate 530 may include conductive connection members 532 as core connection wirings, which are provided in a fan-out region outside an area where the semiconductor chip is arranged, to function as an electrical connection path with the semiconductor chip 200. Accordingly, the semiconductor package 12 may be provided as a fan-out wafer level package.

In example embodiments, the redistribution wiring layer 510 may include a plurality of redistribution wirings 522 electrically connected to chip pads 210 of the semiconductor chip 200 and the conductive connection members 532, respectively. The conductive connection member 532 may include a conductive connection column 532a and a conductive connection pattern 532b.

The semiconductor chip 200 may be mounted on the redistribution wiring layer 510 in a flip chip mounting manner. In this case, the semiconductor chip 200 may be mounted on the redistribution wiring layer 510 such that an active surface, on which the chip pads 210 are formed, of the semiconductor chip 200 faces the redistribution wiring layer 510. The chip pads 210 of the semiconductor chip 200 may be electrically connected to bonding pads of fourth redistribution wirings 522d of the redistribution wiring layer 510 by conductive bumps, e.g., solder bumps 220.

The mold substrate 530 may be provided on the redistribution wiring layer 510 to cover the semiconductor chip 200. For example, the mold substrate 530 may include epoxy molding compound (EMC).

The first transmission contact 312a, the first transmission wiring 312b, the second transmission contact 312c, the second transmission wiring 312d, and the third transmission contact 312e may be provided as the transmission line 312. Accordingly, the radiator pattern layer 330 may be electrically connected to the conductive connection member 532 as the core connection wiring by the transmission line 312.

Hereinafter, a method of manufacturing the semiconductor package in FIG. 20 will be explained.

FIGS. 21 to 29 are cross-sectional views illustrating stages in a method of manufacturing a semiconductor package in accordance with example embodiments.

Figure 21:
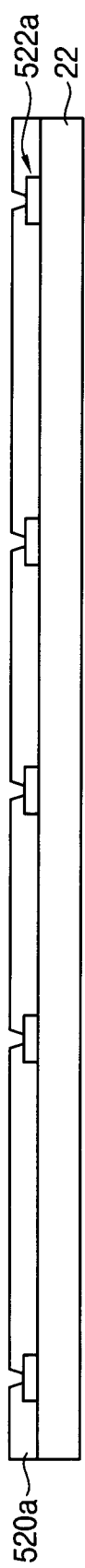
FIGS. 21 to 29 are cross-sectional views illustrating stages in a method of manufacturing a semiconductor package in accordance with example embodiments.
Figure 22:
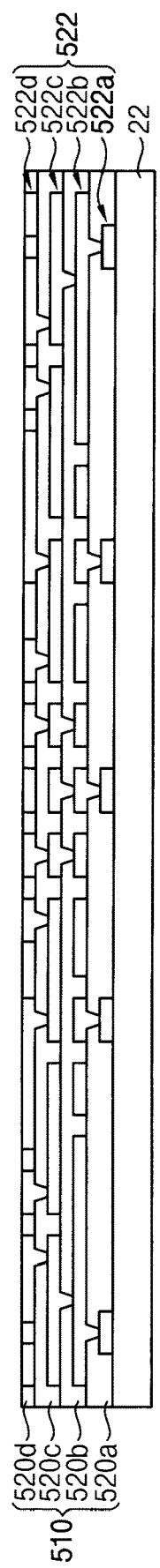

Referring to FIGS. 21 and 22, the redistribution wiring layer 510 may be formed on a dummy substrate 22. In example embodiments, first, the first redistribution wirings 522a may be formed on the dummy substrate 22, and then, the first lower insulation layer 520a having first openings which expose portions of the first redistribution wirings 522a may be formed on the dummy substrate 22.

The dummy substrate 22 may be used as a base substrate on which the redistribution wiring layer is formed. At least one semiconductor chip is stacked on the redistribution wiring layer, and a mold substrate is to be formed to cover the semiconductor chip. The dummy substrate 22 may have a size corresponding to a wafer on which a semiconductor fabrication process is performed. The dummy substrate 22 may include, e.g., a silicon substrate, a glass substrate, or a non-metal or metal plate.

Then, the second redistribution wirings 522b may be formed on the first lower insulation layer 520a on the dummy substrate 22 to make contact with the first redistribution wirings 522a through the first openings. Then, the second lower insulation layer 520b having second openings which expose portions of the second redistribution wirings 522b may be formed on the first lower insulation layer 520a.

Then, the third redistribution wirings 522c may be formed on the second lower insulation layer 520b to make contact with the second redistribution wirings 522b through the second openings. Then, the third lower insulation layer 520c having third openings which expose portions of the third redistribution wirings 522c may be formed on the second lower insulation layer 520b.

Then, the fourth redistribution wirings 522d may be formed on the third lower insulation layer 520c to make contact with the third redistribution wirings 522c through the third openings. Then, the fourth lower insulation layer 520d having fourth openings which expose portions of the fourth redistribution wirings 522d may be formed on the third lower insulation layer 520c.

Thus, the redistribution wiring layer 510 having the redistribution wirings 522 may be formed on the dummy substrate 22.

Figure 23:
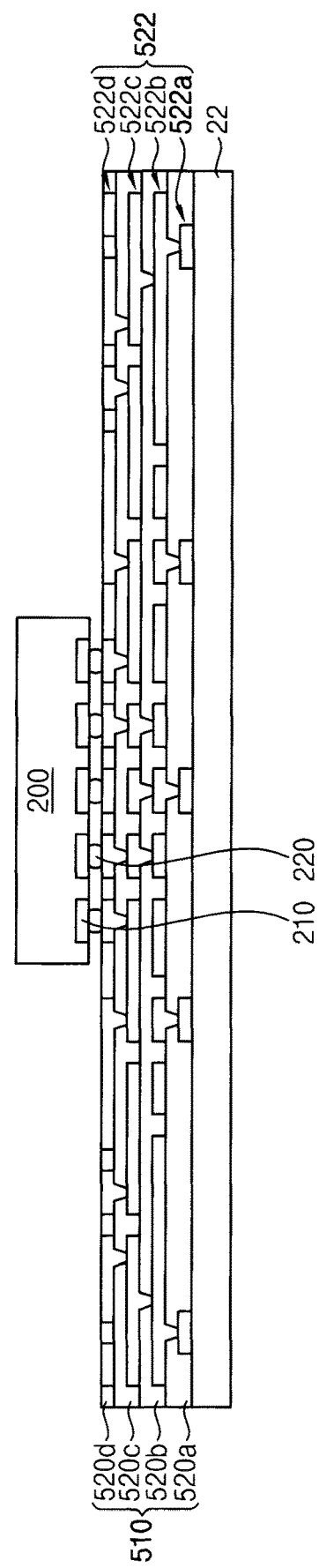

Referring to FIG. 23, the semiconductor chip 200 may be stacked on the redistribution wiring layer 510. In example embodiments, the semiconductor chip 200 may be mounted on the redistribution wiring layer 510 in a flip chip bonding manner. In this case, the semiconductor chip 200 may be mounted on the redistribution wiring layer 510 such that an active surface, including the chip pads 210, of the semiconductor chip 200 faces the redistribution wiring layer 510. The chip pads 210 of the semiconductor chip 200 may be electrically connected to bonding pads of the fourth redistribution wirings 522d of the redistribution wiring layer 510 by conductive bumps, e.g., solder bumps 220. An underfill member may be filled between the active surface of the semiconductor chip 200 and an upper surface of the redistribution wiring layer 510.

Figure 24:
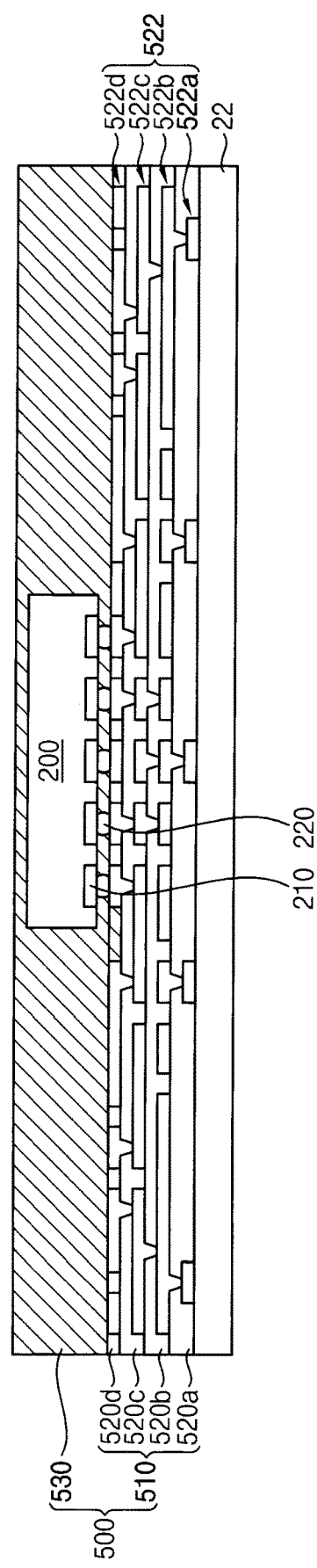

Referring to FIG. 24, the mold substrate 530 may be formed on the redistribution wiring layer 510 to cover the semiconductor chip 200. In example embodiments, the mold substrate 530 covering the semiconductor chip 200 may be formed by a molding process. For example, the mold substrate 530 may include epoxy molding compound (EMC).

Figure 25:
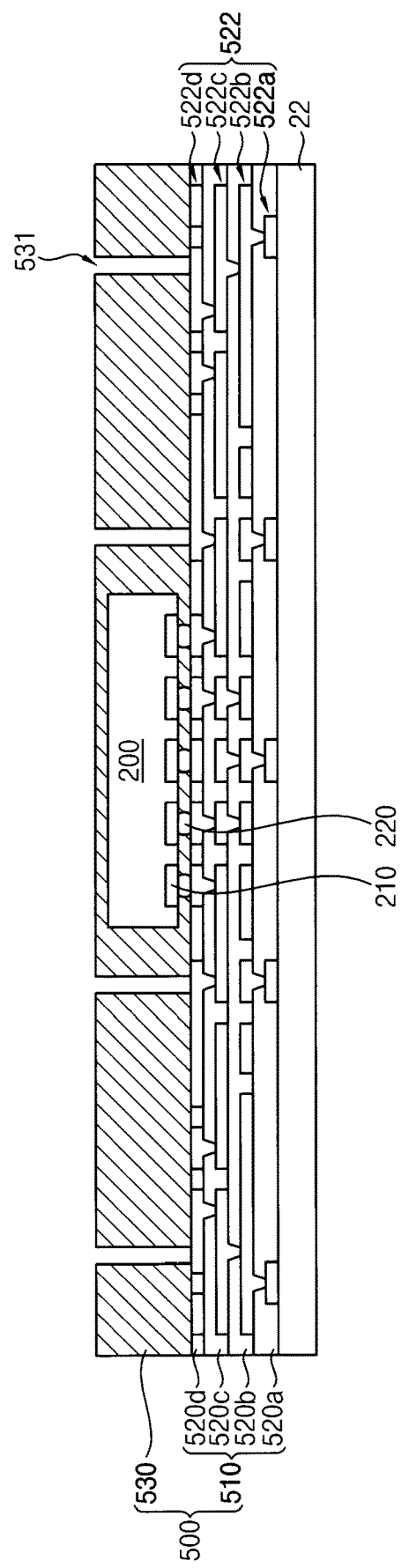
Figure 26:
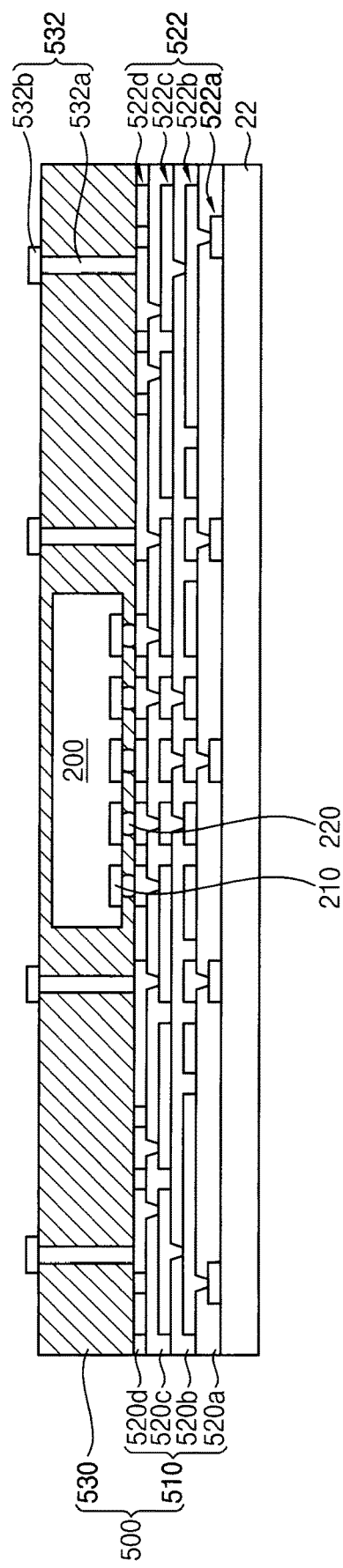

Referring to FIGS. 25 and 26, openings 531 may be formed in the mold substrate 530 to expose conductive connection column regions, respectively. Then, the conductive connection members 532 as core connection wirings may be formed in the openings 531, respectively. The conductive connection member 532 may include the conductive connection column 532a and the conductive connection pattern 532b.

For example, the openings 531 may be formed by a laser drilling process. A plating process may be performed on the pad exposed by the opening 531 to form the conductive connection column 532a. After a seed layer is formed on an upper surface of the mold substrate 530, the seed layer may be patterned to form the conductive connection pattern 532b.

Figure 27:
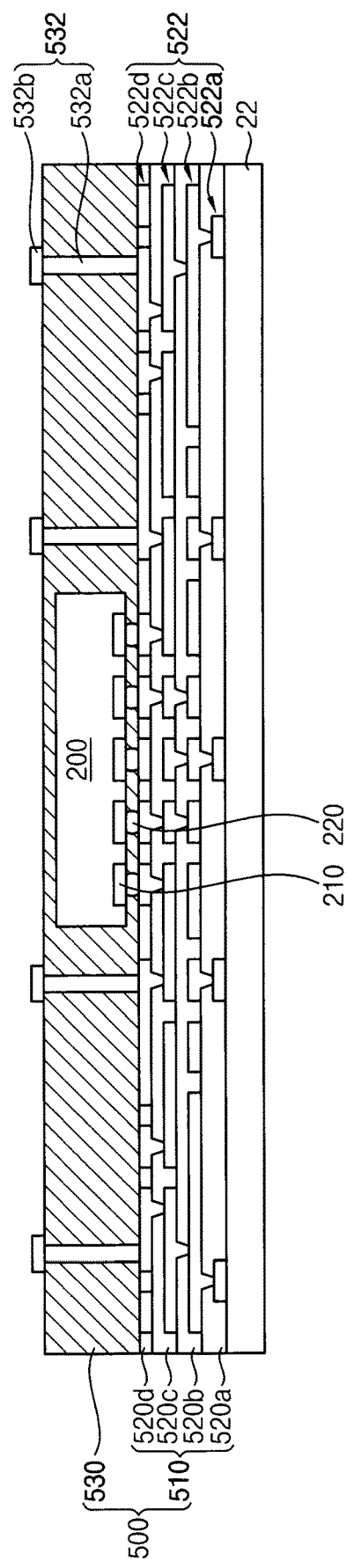
Figure 28:
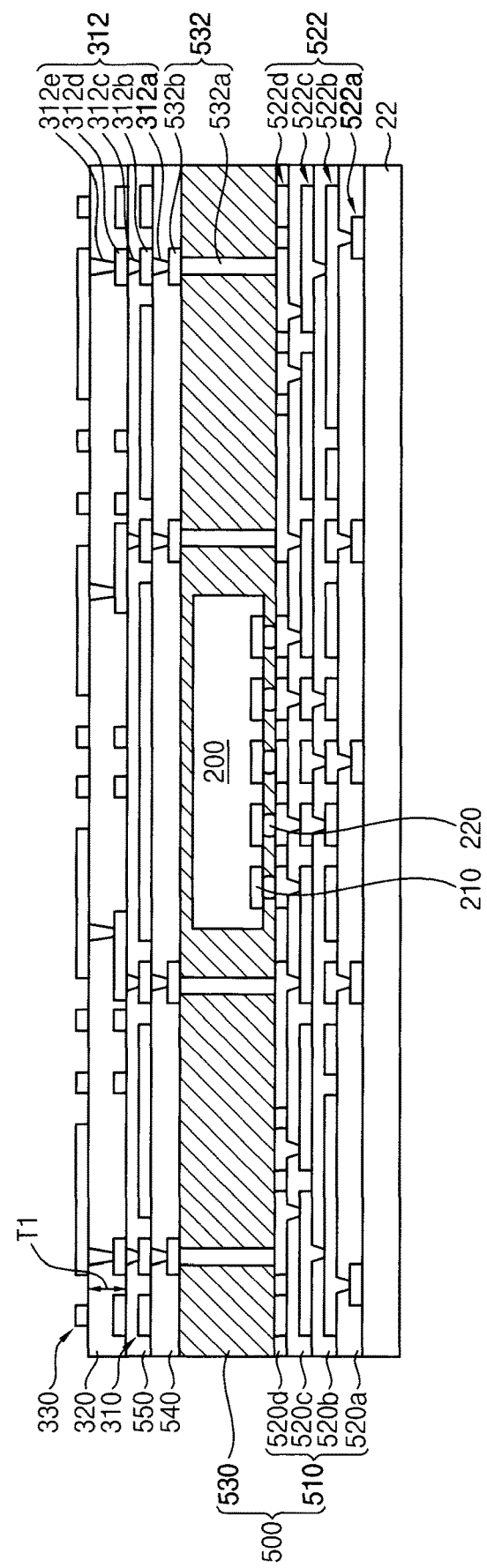

Referring to FIGS. 27 and 28, a first upper insulation layer 540 may be formed on the mold substrate 530, and then, the ground pattern layer 310 may be formed on the first upper insulation layer 540. Then, a second upper insulation layer 550 and the first antenna insulation layer 320 may be formed on the first upper insulation layer 540 to cover the ground pattern layer 310. Then, the radiator pattern layer 330 may be formed on the first antenna insulation layer 320.

In example embodiments, the first and second upper insulation layers 540 and 550 may be formed by a vapor deposition process, a spin coating process, etc. The first and second upper insulation layers 540 and 550 may include, e.g., a polymer layer, a dielectric layer, etc. Alternatively, the first and second upper insulation layers 540 and 550 may include a photo imageable dielectric (PID) material.

After the first upper insulation layer 540 is patterned to form the first transmission contact 312a, the first transmission wiring 312b as a first upper redistribution wiring may be formed on the first upper insulation layer 540. After the second upper insulation layer 550 is patterned to form the second transmission contact 312c, the second transmission wiring 312d as a second upper redistribution wiring may be formed on the second upper insulation layer 550.

After the first antenna insulation layer 320 is patterned to form the third transmission contact 312e, the radiator pattern layer 330 as a third upper redistribution wiring may be formed on the first antenna insulation layer 320. The radiator pattern layer 330 may be electrically connected to the third transmission contact 312e.

The first transmission contact 312a, the first transmission wiring 312b, the second transmission contact 312c, the second transmission wiring 312d, and the third transmission contact 312e may be provided as the transmission line 312. Accordingly, the radiator pattern layer 330 may be electrically connected to the conductive connection member 532 as the core connection wiring by the transmission line 312.

Figure 29:
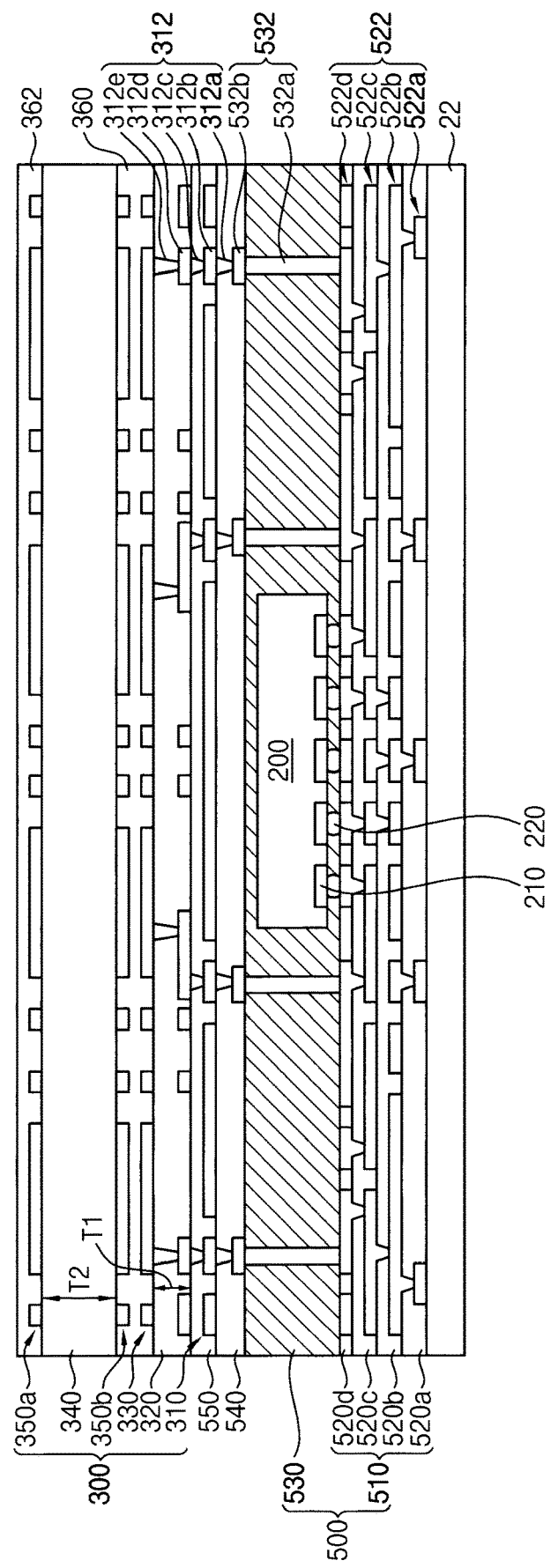

Referring to FIG. 29, the second antenna insulation layer 340 may be formed on the radiator pattern layer 330. The first director pattern layer 350a may be formed on the upper surface of the second antenna insulation layer 340, and the second director pattern layer 350b may be formed on the lower surface of the second antenna insulation layer 340. The second antenna insulation layer 340 having the first and second director pattern layers 350a and 350b formed thereon may be adhered on the radiator pattern layer 330 in the form of a core substrate.

The first and second director pattern layers 350a and 350b may have shapes corresponding to each other. Additionally, the radiator pattern layer 330 may have a shape corresponding to the first and second director pattern layers 350a and 350b.

By way of summation and review, due to an increase in thickness of a dielectric material in an antenna implemented in an AiP, in which the RFIC is mounted, warpage due to a difference in thermal expansion coefficients may occur, and new dielectric material and antenna structure may be required in order to prevent loss in a feed line and improve antenna radiation gain. Therefore, example embodiments provide a semiconductor package capable of preventing warpage and improving antenna radiation gain, and a method of manufacturing the same.

That is, according to example embodiments, a semiconductor package may include a fan-out package and an antenna structure on the fan-out package. The antenna structure may include a ground pattern layer, a first antenna insulation layer, a radiator pattern layer, a second antenna insulation layer, and a director pattern layer sequentially stacked on one another. The antenna structure may be disposed on and separated from a frame in which a semiconductor chip is mounted, by the ground pattern layer. A second thermal expansion coefficient of the second antenna insulation layer may be smaller than a first thermal expansion coefficient of the first antenna insulation layer, and the second thermal expansion coefficient of the second antenna insulation layer may be the same as or similar to a thermal expansion coefficient of the frame. Additionally, a thickness of the second antenna insulation layer may be greater than a thickness of the first antenna insulation layer. Accordingly, warpage due to a difference in thermal expansion coefficient between the fan-out package and the antenna structure may be prevented, the thickness of the antenna insulation layer may be increased, and thus, antenna radiation gain may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a redistribution wiring layer having redistribution wirings;
a semiconductor chip on the redistribution wiring layer;
a frame on the redistribution wiring layer, the frame surrounding the semiconductor chip, and the frame having core connection wirings electrically connected to the redistribution wirings; and
an antenna structure on the frame, the antenna structure including a ground pattern layer, a first antenna insulation layer, a radiator pattern layer, a second antenna insulation layer, and a director pattern layer sequentially stacked on one another.

2. The semiconductor package as claimed in claim 1, wherein the first antenna insulation layer has a first thermal expansion coefficient, and the second antenna insulation layer has a second thermal expansion coefficient smaller than the first thermal expansion coefficient.

3. The semiconductor package as claimed in claim 2, wherein the second thermal expansion coefficient is within a range of ⅓ to ¼ of the first thermal expansion coefficient.

4. The semiconductor package as claimed in claim 2, wherein the second thermal expansion coefficient of the second antenna insulation layer is a same as a thermal expansion coefficient of the frame.

5. The semiconductor package as claimed in claim 1, wherein the first antenna insulation layer has a first thickness, and the second antenna insulation layer has a second thickness greater than the first thickness.

6. The semiconductor package as claimed in claim 5, wherein the first thickness of the first antenna insulation layer is in a range of 100 μm to 150 μm, and the second thickness of the second antenna insulation layer is in a range of 150 μm to 350 μm.

7. The semiconductor package as claimed in claim 1, wherein the radiator pattern layer is electrically connected to the core connection wirings by a transmission line.

8. The semiconductor package as claimed in claim 7, wherein the transmission line extends through a via hole in the ground pattern layer.

9. The semiconductor package as claimed in claim 1, wherein the second antenna insulation layer includes a same material as the frame.

10. The semiconductor package as claimed in claim 1, wherein the semiconductor chip includes a radio frequency integrated circuit (RFIC) for wireless communication.

11. A semiconductor package, comprising:
a frame having a cavity;
a semiconductor chip in the cavity, the semiconductor chip including chip pads;
a redistribution wiring layer on a lower surface of the frame, the redistribution wiring layer having redistribution wirings electrically connected to the chip pads of the semiconductor chip; and
an antenna structure on an upper surface of the frame, the antenna structure including a ground pattern layer, a first antenna insulation layer, a radiator pattern layer, a second antenna insulation layer, and a director pattern layer sequentially stacked on one another,
wherein the first antenna insulation layer has a first thermal expansion coefficient, and the second antenna insulation layer has a second thermal expansion coefficient smaller than the first thermal expansion coefficient.

12. The semiconductor package as claimed in claim 11, wherein the second thermal expansion coefficient is in a range of ⅓ to ¼ of the first thermal expansion coefficient.

13. The semiconductor package as claimed in claim 11, wherein the second thermal expansion coefficient of the second antenna insulation layer is a same as a thermal expansion coefficient of the frame.

14. The semiconductor package as claimed in claim 11, wherein the first antenna insulation layer has a first thickness and the second antenna insulation layer has a second thickness greater than the first thickness.

15. The semiconductor package as claimed in claim 11, wherein:
the frame includes core connection wirings, and
the radiator pattern layer is electrically connected to the core connection wirings by a transmission line, the transmission line extending through a via hole in the ground pattern layer.

16. A semiconductor package, comprising:
a semiconductor chip;
a frame surrounding the semiconductor chip, the frame having core connection wirings;
a redistribution wiring layer on a lower surface of the frame, the redistribution wiring layer having redistribution wirings electrically connected to chip pads of the semiconductor chip; and
an antenna structure on an upper surface of the frame, the antenna structure including a ground pattern layer, a first antenna insulation layer, a radiator pattern layer, a second antenna insulation layer, and a director pattern layer sequentially stacked on one another,
wherein the radiator pattern layer is electrically connected to the redistribution wirings through the core connection wirings.

17. The semiconductor package as claimed in claim 16, wherein the first antenna insulation layer has a first thermal expansion coefficient, and the second antenna insulation layer has a second thermal expansion coefficient smaller than the first thermal expansion coefficient.

18. The semiconductor package as claimed in claim 17, wherein the second thermal expansion coefficient is within a range of ⅓ to ¼ of the first thermal expansion coefficient.

19. The semiconductor package as claimed in claim 17, wherein the second thermal expansion coefficient of the second antenna insulation layer is a same as a thermal expansion coefficient of the frame.

20. The semiconductor package as claimed in claim 16, wherein the first antenna insulation layer has a first thickness and the second antenna insulation layer has a second thickness greater than the first thickness.

* * * * *